(12) United States Patent
Brukilacchio et al.

(10) Patent No.: US 7,832,878 B2
(45) Date of Patent: Nov. 16, 2010

(54) LIGHT EMITTING DIODE PROJECTION SYSTEM

(75) Inventors: Thomas J. Brukilacchio, Reading, MA (US); Charles A. Demilo, Marblehead, MA (US)

(73) Assignee: Innovations In Optics, Inc., Woburn, MA (US)

( * ) Notice: Subject to any disclaimer, the term of this patent is extended or adjusted under 35 U.S.C. 154(b) by 902 days.

(21) Appl. No.: 11/655,313

(22) Filed: Jan. 19, 2007

(65) Prior Publication Data

US 2007/0206390 A1 Sep. 6, 2007

Related U.S. Application Data

(60) Provisional application No. 60/779,556, filed on Mar. 6, 2006.

(51) Int. Cl.
*G03B 21/28* (2006.01)
*F21V 7/04* (2006.01)

(52) U.S. Cl. ............................. 353/99; 353/94; 313/512; 362/555; 362/800; 385/133; 385/901

(58) Field of Classification Search ............... 353/31, 353/98, 99; 385/133, 901; 362/551, 555, 362/559, 561; 313/512
See application file for complete search history.

(56) References Cited

U.S. PATENT DOCUMENTS

| | | | | |
|---|---|---|---|---|
| 4,915,479 | A * | 4/1990 | Clarke | 349/62 |
| 6,205,998 | B1 * | 3/2001 | Winston | 126/692 |
| 6,272,269 | B1 * | 8/2001 | Naum | 385/43 |
| 6,318,863 | B1 * | 11/2001 | Tiao et al. | 353/31 |
| 6,871,982 | B2 * | 3/2005 | Holman et al. | 362/331 |
| 6,967,986 | B2 * | 11/2005 | Kowarz et al. | 372/102 |
| 6,968,103 | B1 * | 11/2005 | Schroll et al. | 385/30 |
| 7,001,084 | B2 * | 2/2006 | Carpenter et al. | 385/95 |
| 7,153,015 | B2 * | 12/2006 | Brukilacchio | 362/555 |
| 7,210,806 | B2 * | 5/2007 | Holman et al. | 362/19 |
| 7,234,820 | B2 * | 6/2007 | Harbers et al. | 353/94 |
| 7,455,410 | B2 * | 11/2008 | Furusawa et al. | 353/94 |
| 7,481,538 | B2 * | 1/2009 | Furusawa et al. | 353/20 |
| 2002/0114168 | A1 | 8/2002 | Pelka et al. | |
| 2005/0169579 | A1 * | 8/2005 | Temkin et al. | 385/37 |
| 2005/0224826 | A1 | 10/2005 | Keuper et al. | |

(Continued)

OTHER PUBLICATIONS

Welford, W.T. and Winston, R., "High Collection Nonimaging Optics", Academic Press, pp. 55-64 and pp. 82-84 (1989).

(Continued)

*Primary Examiner*—William C Dowling
(74) *Attorney, Agent, or Firm*—Francis J. Caufield

(57) ABSTRACT

The present invention generally relates to video and/or television projection systems, and more particularly, to LED based light source systems utilizing generally non-rotationally symmetric, preferably oblong or rectangular, non-imaging collection optics for providing improved projection systems relative to arc lamp and other LED based light source systems. The non-rotationally symmetric non-imaging collection optics are configured to operate with LEDs to provide preferred, generally, uniform light distributions whose étendues match those of downstream applications such as those encountered in projection systems. Also provided are various arrangements for coupling LED output to the entrance aperture of collection optics and for coupling the outputs from a plurality of collection optic outputs to form single beams of illumination of preferred patterns, intensities, and color.

27 Claims, 16 Drawing Sheets

U.S. PATENT DOCUMENTS

2005/0243570 A1* 11/2005 Chaves et al. ............... 362/551
2005/0275819 A1* 12/2005 Tolbert et al. ................. 355/67
2006/0043400 A1* 3/2006 Erchak et al. ................. 257/98
2006/0189013 A1* 8/2006 Schardt et al. ................ 438/26

OTHER PUBLICATIONS

International Search Report and Written Opinion from International Patent Application No. PCT/US07/01571 mailed on May 1, 2008.

* cited by examiner

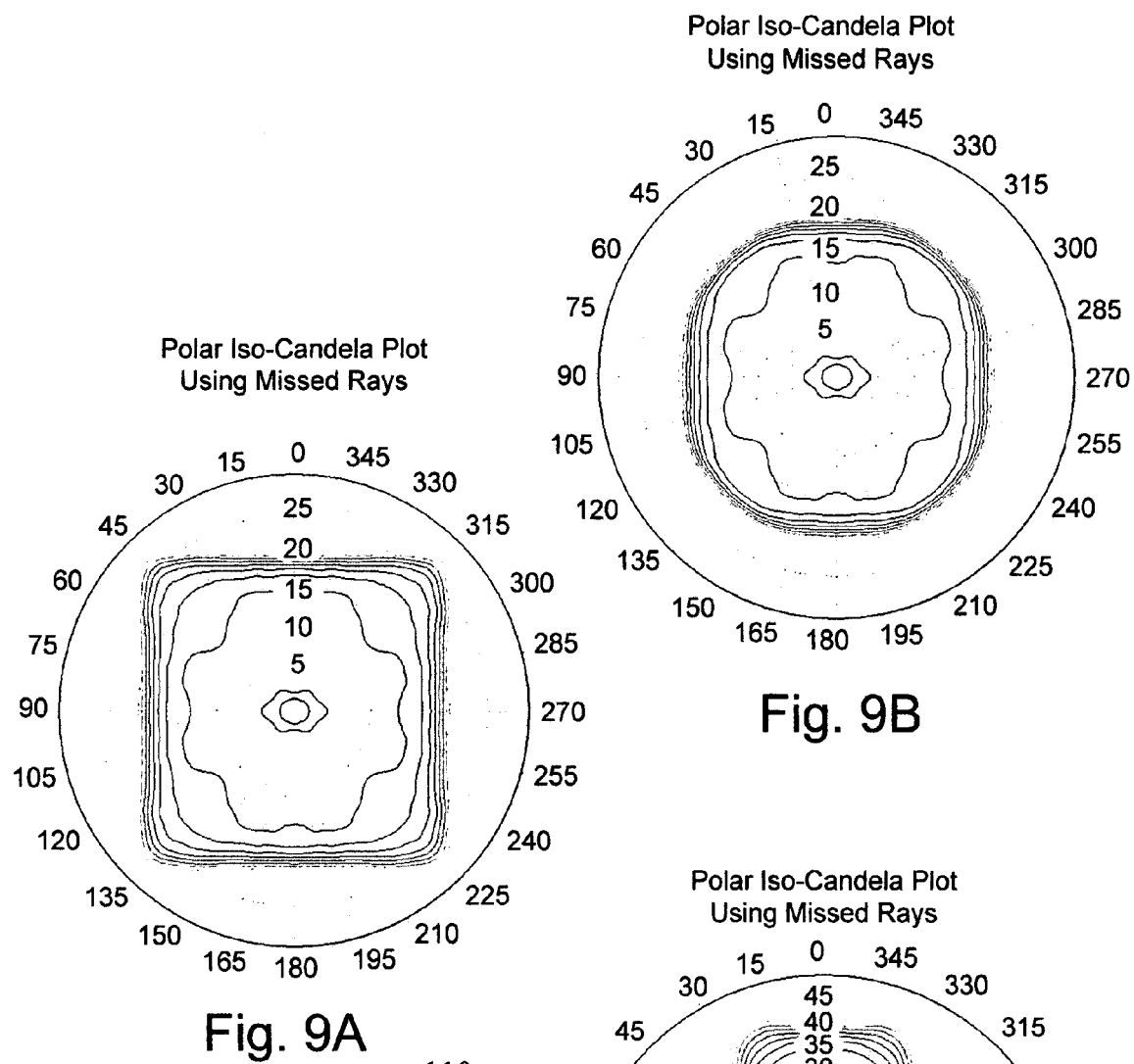
Fig. 9A
Fig. 9B
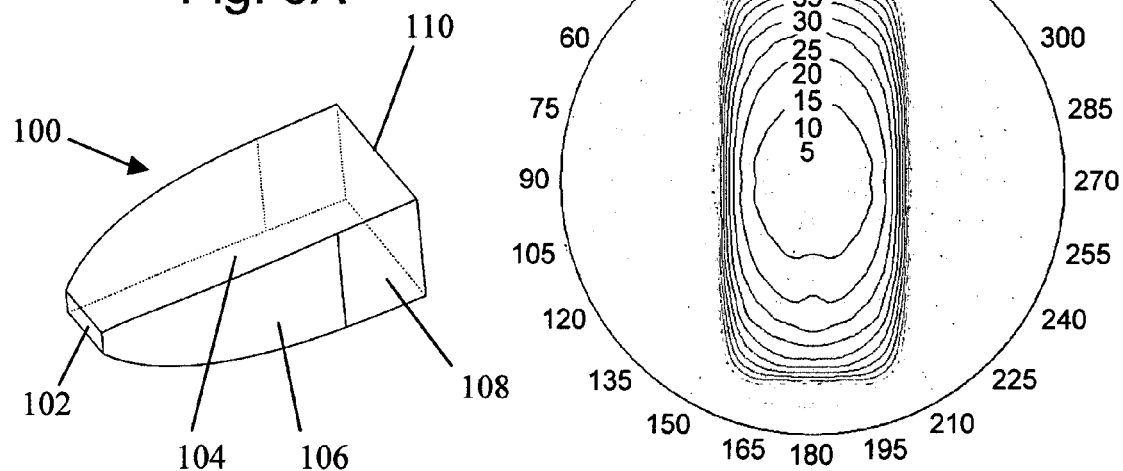
Fig. 10A
Fig. 10B

Polar Iso-Candela Plot Using Incident Rays On NA Filter Bottom

Polar Iso-Candela Plot Using Incident Rays On NA Filter Bottom

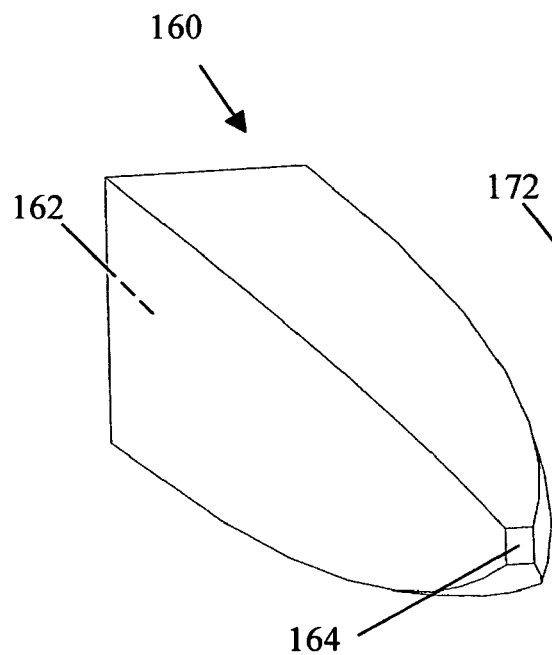
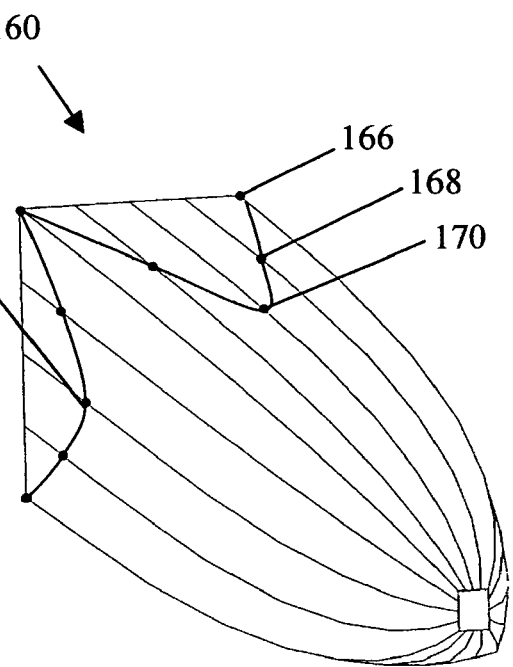
Fig. 16A                      Fig. 16B
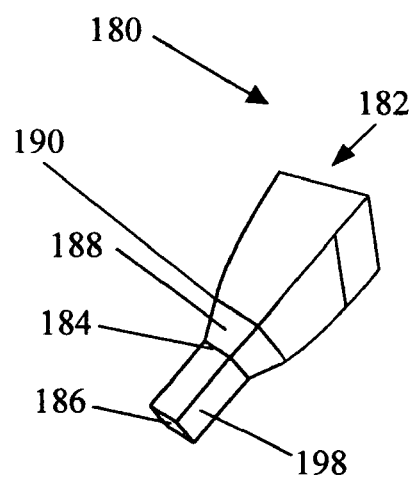
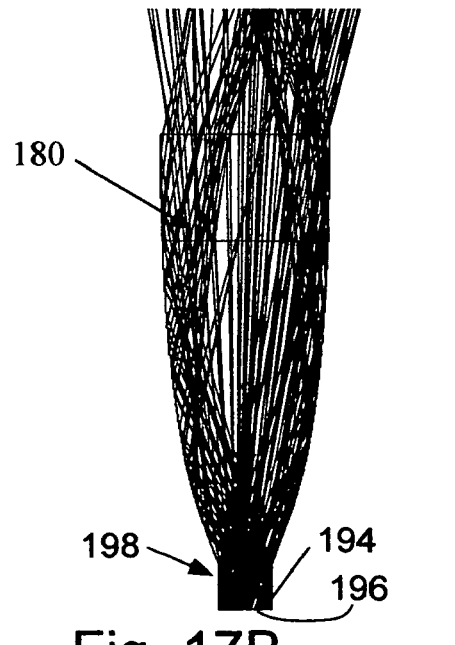
Fig. 17A                      Fig. 17B

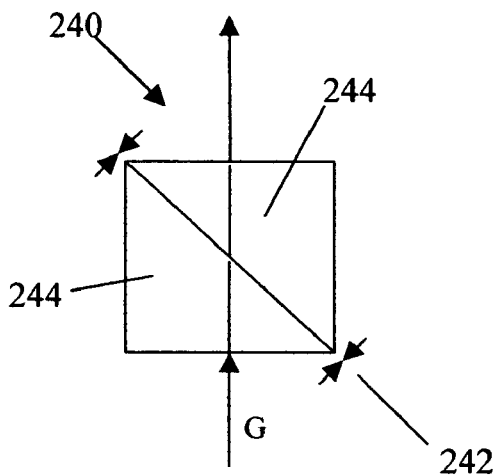
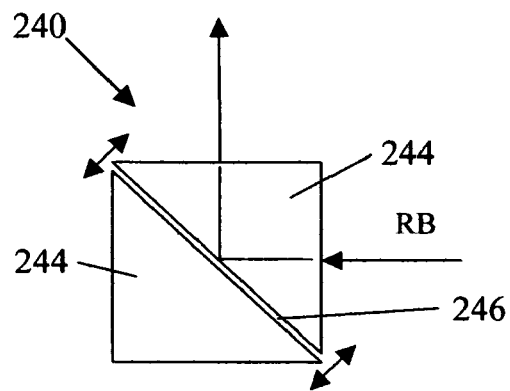
Fig. 24A          Fig. 24B
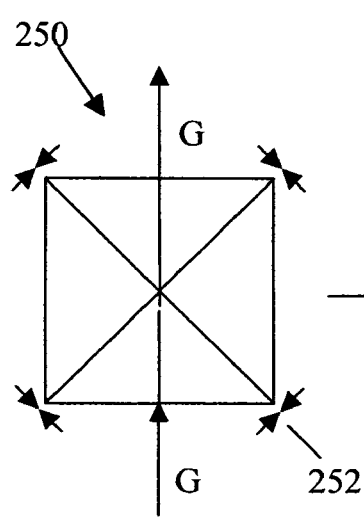
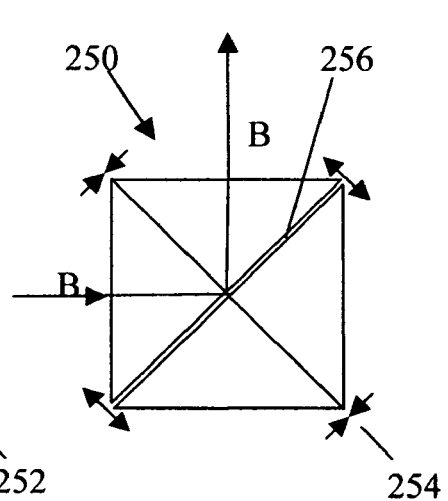
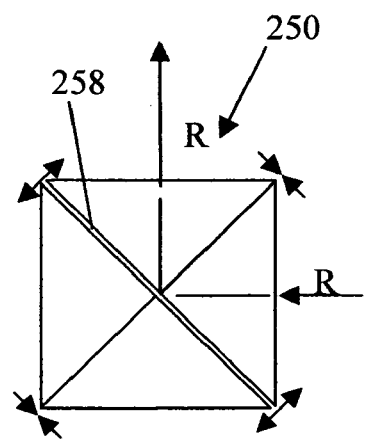
Fig. 25A     Fig. 25B     Fig. 25C

LIGHT EMITTING DIODE PROJECTION SYSTEM

CROSS-REFERENCE TO RELATED APPLICATION

This application claims the benefit of priority from U.S. Provisional Patent Application No. 60/779,556 filed on Mar. 6, 2006 in the name of Thomas J. Brukilacchio, et al. with the title LIGHT EMITTING DIODE PROJECTION SYSTEM, the entire contents of which are incorporated herein by reference.

FIELD OF THE INVENTION

This invention, in general, relates to projection apparatus and more particularly to the use of light emitting diodes as a source of illumination in a projection system.

BACKGROUND OF THE INVENTION

More powerful and brighter LED light sources are in high demand for challenging applications such as projection systems (rear and front projection televisions). Prior projection systems typically utilized short arc lamps such as high-pressure mercury, metal halide, and xenon. These lamps are capable of very high luminous emittance and are therefore suitable sources for the étendue limited projection systems and are used almost exclusively in today's commercial front and rear projection systems. However, there are problems associated with these lamp technologies including poor luminous efficacy, thereby requiring high power and associated means of cooling, short lifetime, poor color gamut (number of colors that can be reproduced given the spectrum of the lamps), high voltage operation (typically kilovolts required to turn them on), high cost, and use of mercury, which is becoming an environmental hazard and is in the process of undergoing regulations in numerous countries throughout the world.

Only recently has there been recognition that LEDs could be used to replace more traditional light sources in video projection systems. In particular, LEDs provide much improved lifetime, color gamut, lower cost of ownership, lower power consumption (enabling some battery operated portable devices), decreased cooling requirements, and freedom form mercury relative to conventional arc lamps. To date, there have been several companies that have demonstrated future products based on LED sources in projection systems. The luminous emittance of these systems, however, has not been sufficient. The LED projection system embodiments described herein provide much improved luminous emittance and lifetime relative to existing LED based systems.

U.S. Pat. No. 7,153,015 by Brukilacchio describes the use of LED die or LED die array substantially filling the input aperture of a dielectric filled non-imaging concentrator with a compound parabolic profile and a high performance thermal interface. This type of configuration and derivatives thereof can be effectively used in projection systems. Brukilacchio describes a concentrator with a substantially circular cross section. While this device is described as having an efficiency of 96% with respect to the light entering the input aperture of the concentrator leaving the exit aperture within the desired solid angle while substantially preserving the étendue, the circular cross section concentrator is not a good match to the aperture of typical rectangular format video modulation devices. Thus, for example, a XGA format (1024 by 768 pixels) aperture inscribed in a circle for which the vertices of the rectangle lie on the diameter of the circle would waste approximately 40% of the light emitted from an associated LED source with a concentrator of circular cross section.

Accordingly, it is a primary object of the present invention to provide projection systems that efficiently utilize the output from one or more LED sources.

It is another object of the present invention to provide an LED projection illumination system that efficiently matches the étendue of an LED source to that of a digital modulation device (DMD) for forming images.

It is another object of the present invention to provide devices for efficiently coupling the outputs from a plurality of LED sources and directing them along a common path.

It is another object of the present invention to provide specially configured non-imaging optics for forming circular far fields from LEDs having non-circular geometries.

Other objects of the invention will be obvious and will appear hereinafter when the following detailed description is read in conjunction with the drawings.

SUMMARY OF THE INVENTION

The invention herein describes a video projection system, which incorporates a light emitting diode (LED) light source with one or more distinct colors. The LED die or die array is mounted to a high thermal conductivity circuit board. One or more non-imaging, generally non-rotationally symmetric, optics collect the light from the typically red, green and blue LED die. The light is then combined in a common path by various means. The light can also be homogenized before or after the colors are combined. The near field of the collected and combined LED light is then imaged onto a video modulation device such as a digital micro-mirror device (DMD) form Texas Instruments or a liquid crystal on silicon (LCOS) light modulator available from a number of sources including Sony. After the light is incident on the video device, it is either directed into a projection lens or extinguished by being reflected into a beam dump, as in the case of the DMD, or absorbed by the crossed polarization of a LCOS device. The light that is directed through the projection lens is imaged onto a screen, either in a front projection or rear projection application. Alternatively, a virtual image can be displayed, such as in a "heads up display" (HUD) video system.

The non-imaging collectors of the present invention preferably utilize rectangular apertures for more efficient coupling of available output to rectangular shaped DMDs. Another benefit of the rectangular cross section non-imaging collector is that the rectangular input aperture is a much better match with respect to the LED die shape, which is typically also rectangular. This permits the use of larger format LED die, which typically have better performance than small LED die, and offer a cost economy as well. Modifications of a substantially compound parabolic profile are described that result in increased luminous emittance of the LED projection source. Several means of combining the light from the different color LED die are described along with means of homogenizing the light emitted from the source or as incident on the video modulator.

Air spaced LEDs, as opposed to index matched, are used in conjunction with hollow non-imaging collectors to take advantage of the benefit of increased extraction efficiency for LED die having features incorporated in the die structure for the expressed purpose of increased extraction efficiency such as mirrors below the epitaxial layer, surface roughening, facets, micro-lenses, micro-prisms, photonic lattices, etc. Thus, luminous emittance is improved by utilizing a hollow concentrator.

Solid dielectric non-imaging collector embodiments comprising CPC profiles enlarged at the entrance aperture using blended tangential conical sections are provided to mimic the performance that can be achieved with hollow non-imaging collector optics with air spaced LEDs. By modifying the shape of the collector in this manner from that of a CPC profile designed to collect a full $2\pi$ steradians (hemisphere) of light emitted from a source, further increases in luminous emittance can be achieved. Collecting less than $2\pi$ steradians allows the LED die area to increase assuming a constant étendue. The total integrated light emitted from an LED with a substantially Lambertian distribution at angles far from the surface normal is very small, falling off as the square of the cosine of the angle from the surface normal. Thus, the angles far from the normal do not contribute to the total emitted flux in the same proportion, as do the smaller angles. The increase in light from the increased surface area for configurations that exclude these high angles increases faster than the loss due to the reduced collection cone. Thus, there is an increase in the luminous emittance from the exit aperture of the collector. As will be shown, the increase in output requires an increase in drive power to the LED which scales with the LED die area.

An illumination and projection system is described which takes advantage of the asymmetry of the DMD by limiting the far field to 12 degrees half angle in the plane of the mirror tilt, but at a larger collection angle in the plane perpendicular to the mirror tilt. Thus for an illumination and projection system with an asymmetric far field of f/2.4 in the plane of the mirror tilt and f/1.2 in the orthogonal plane, the system throughput is twice that of a system limited to the higher f/# in both directions. This approach offers a significant performance benefit with respect to on-screen brightness.

Other applications of the LED module described herein include replacement of Xenon arc lamp systems for industrial and medical illumination such as surgical endoscopes, surgical headlamps, and high-end vision systems. Another application is the side injection of light for LCD backlighting systems for which increases in diagonal size have driven the requirement for significantly more optical power and efficiency relative to conventional cold cathode fluorescent lamp (CCFL) systems.

BRIEF DESCRIPTION OF THE DRAWINGS

The structure, operation, and methodology of the invention, together with other objects and advantages thereof, may best be understood by reading the following detailed description in connection with the drawings in which each part has an assigned numeral or label that identifies it wherever it appears in the various drawings and wherein:

FIGS. 9A and 9B are two dimensional topographical plots of the far field intensity distribution of the CPC of FIG. 3;

FIG. 10A is an isometric view of a rectangular CPC having an asymmetric far field;

FIG. 10B is an Iso Candela plot of the rectangular far field of the CPC of FIG. 10A;

FIGS. 16A and 16B are diagrammatic perspective views showing rectangular CPCs designed from more than two CPC curves for the purpose of obtaining a substantially circular far field while maintaining a rectangular near field;

FIG. 17A is a diagrammatic perspective view showing the CPC of FIG. 11B with an input extension of rectangular cross section for the purpose of providing improved uniformity;

FIG. 17B is a ray trace through the extended CPC of FIG. 17A;

FIGS. 24A and 24B are diagrammatic views showing a piezo electric actuated total internal reflection active beam splitter for coupling two independent beams;

FIGS. 25A, 25B, and 25C are diagrammatic views showing a piezo electric actuated total internal reflection active beam splitter for coupling three independent beam paths, for example red, green, and blue light;

DETAILED DESCRIPTION

The present invention generally relates to video projection systems and, more particularly, to LED based light source systems utilizing generally non-rotationally symmetric non-imaging collection optics for providing improved projection systems relative to arc lamp and other LED based light source systems. The non-rotationally symmetric non-imaging collection optics are configured to operate with LEDs to provide preferred, generally, uniform light distributions whose étendues match those of downstream applications, such as those encountered in modern video projection systems. Also provided are various arrangements for coupling LED output to the entrance aperture of collection optics and for coupling the outputs from a plurality of collection optics to form single beams of illumination of preferred patterns, intensities, and color.

Figure 1:
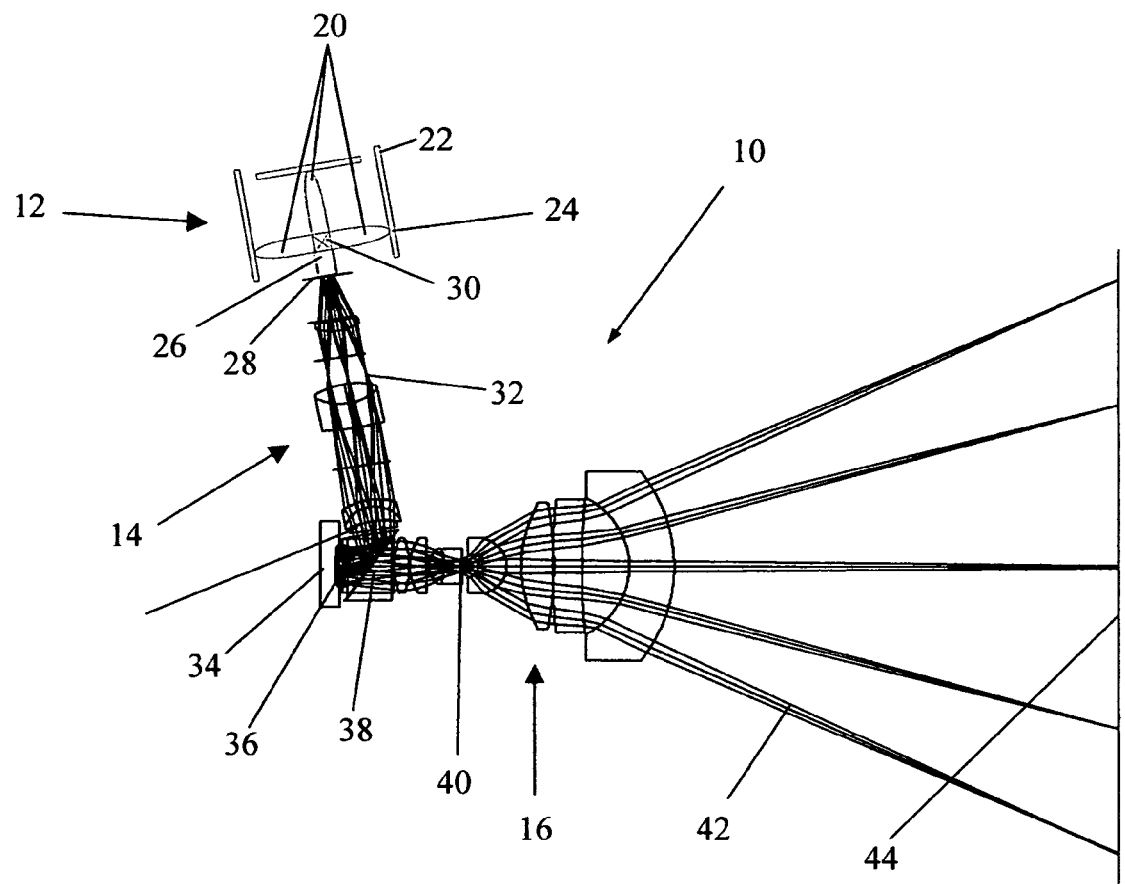
FIG. 1 is a diagrammatic plan view showing a 3-color LED projection light source acting as the input to a lens system that relays the LED light to the plane of a digital imaging device such as a Digital Micromirror Device (DMD) that, in turn, produces an image through a projection lens onto a video screen.

Referring now to FIG. 1, there is shown a three-color LED based projection system 10. System 10 comprises an LED source system 12 that is coupled to a DMD or LCOS modulator 36, or the like, by means of a conventional relay lens 14. A projection lens 16 having a circular aperture stop 40 images the video from the modulator 36 onto a screen 44 for viewing by an observer.

Prior to LED based systems, conventional arc lamp based projection systems used for projection purposes employed a short arc lamp, typically of the high pressure mercury, metal halide, or xenon lamp variety. Such projection arc lamps were usually imaged through a rotating color wheel onto the DMD, which was then imaged by the projection lens onto the screen. Since such arc lamps emit light over a broad wavelength spectrum they needed to be filtered by the color wheel to provide the necessary colors and spectral widths. The LED system 10 of FIG. 1 is much more efficient, has longer source life, on the order of 10's of thousands of hours relative to that of lamps of several hundred to a couple of thousand hours, contains no mercury as does a lamp, and can be readily modulated to provide the color sequential light required of a single DMD projection system.

Figure 2:
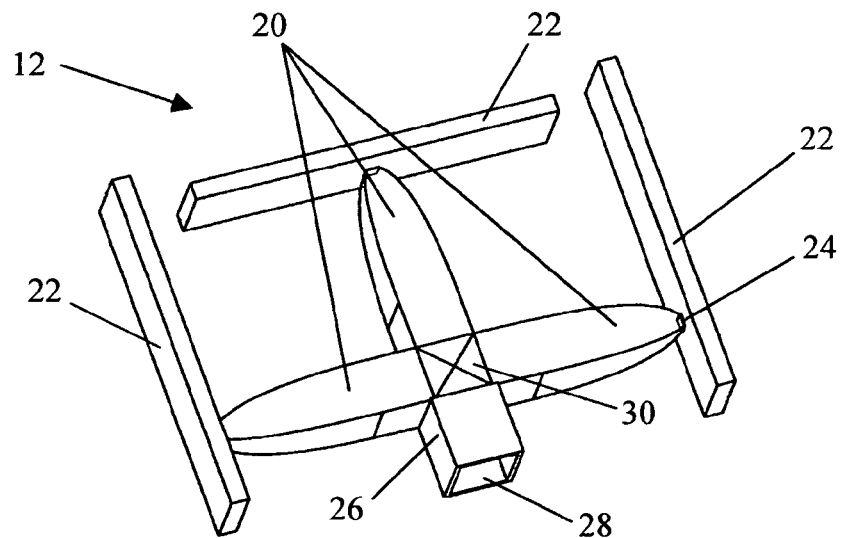
FIG. 2 is an enlarged diagrammatic perspective view of the LED projection light source of FIG. 1 shown in more detail 3 rectangular compound parabolic concentrators (CPCs), a waveguiding X-Cube, and a mixing pipe.

The LED light source system 12, shown enlarged in diagrammatic perspective in FIG. 2, provides extremely high luminous emittance in a more compact package relative to other LED based systems. The LED light source system 12 comprises three non-rotationally symmetric dielectric CPC collection optics 20, preferably rectangular in cross-section, along with associated LED die that substantially fill their respective input apertures 24 (only one designated on the right). The LED die, which may be arrays or large surface emitters in form, are located at the input apertures 24 and are attached directly to high performance thermal conductor LED boards 22 described in greater detail below. The CPCs 20 are preferably made solid of a dielectric material such as acrylic, polycarbonate, Zeonex, etc. having properties of low absorption over the spectral range of the LED sources along with good thermal and mechanical performance. Typically, there is an index-matching medium, such as silicone gel, between the surface of the LED die and the input aperture 24 of a corresponding CPC collection optic 20. The output of the three CPCs 20 is coupled to a light piping X-Cube 30, which acts to collect and direct the three colors as a single beam toward a rectangular output aperture 28, in turn, imaged onto the DMD 36 via relay lens 14. As is well known, the output in the vicinity of the output aperture 28 represents the near field which becomes the far field further away; the near field conventionally being within ten times the diameter of a source and the far field beyond that. The interface between the output apertures (See numeral 46 in FIG. 3) of the CPCs 20 and the respective input faces of the X-Cube 30 can be air or a sufficiently low index of refraction optical coupling material such that all the light exiting the apertures of the CPCs 20 is confined to the dimensions of the X-cube 30, as will be demonstrated below.

The light exiting the X-cube 30, acting as a spectral beam combiner, can be imaged directly onto the DMD 36 or be further homogenized by a light pipe 26. The light exiting the aperture 28 of light pipe 26 would then be imaged onto the DMD 36 by relay lens 14. The light pipe 26 can be hollow as shown here or be composed of a solid dielectric. The advantage to a hollow reflector is that there is not an optic surface on which imperfections could reside and be reimaged onto the DMD 36, and thereby onto the screen 44, where an observer can see it. Also, it is easier to tilt the exit aperture 28 to get a degree of keystone correction where desired, as will be discussed below. The disadvantage of a hollow light pipe is that there is a finite loss upon each reflection, which is tolerable for short light pipes, but could be problematic for long ones with respect to the total optical power on the screen.

Figure 3:
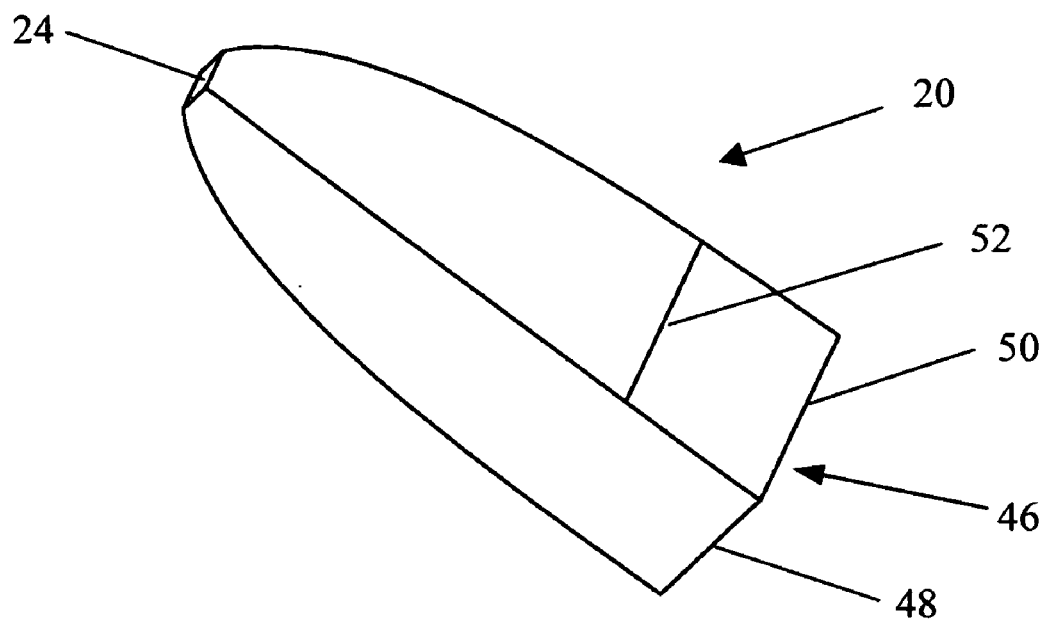
FIG. 3 is a diagrammatic perspective view showing a single rectangular CPC used in the light source of FIG. 2 to provide light at equal output angles.

A closer view of a single solid dielectric rectangular CPC 20 is shown in diagrammatic perspective in FIG. 3. The output aperture 46, along with the other parameters of CPC 20, is designed so there is a match with the étendue of the modulator 36. The étendue of the modulator is typically given by the product of its area, solid angle of acceptance, and the square of the refractive index (typically air), and is typically expressed in $mm^2$-steradians. The output aperture 46 has substantially the same aspect ratio as that of the DMD 36. The dimensions depend on the magnification ratio of the relay 14. The profile of the CPC 20 is preferably that of a compound parabolic concentrator in both orthogonal axes (i.e., the x-z plane and the y-z plane, taking the z-axis as the longitudinal optical axis), assuming collection of the full typically Lambertian emission profile from an LED die. Thus, for a symmetric far field angle out of the CPC, the input aperture 24 of the CPC 20 has the same aspect ratio as the output aperture 46. The lengths and shapes of the CPC profiles are different in the two axes. Thus, the shorter dimension has a shorter overall length and must be extended from line 52 to the output face at edge 50. The CPC shapes and lengths in the two orthogonal axes are determined by first setting the desired output angle and dimension. Using standard CPC equations, this sets corresponding input dimensions and lengths. The input dimensions are combined to define an input rectangle, and the difference in CPC lengths is made up for by providing a linear section from the length of the shorter CPC profile to the end of the longer CPC profile to arrive at the overall solid shape of the CPC. At the four corners of the CPC, i.e., along diagonals, the shape of the CPC is simply the intersection of the two CPC shapes in orthogonal planes x-z and y-z. Calculations for arriving at the shape of a CPC can be conveniently carried out using a spreadsheet containing relevant parameters and CPC equations.

Figure 4:
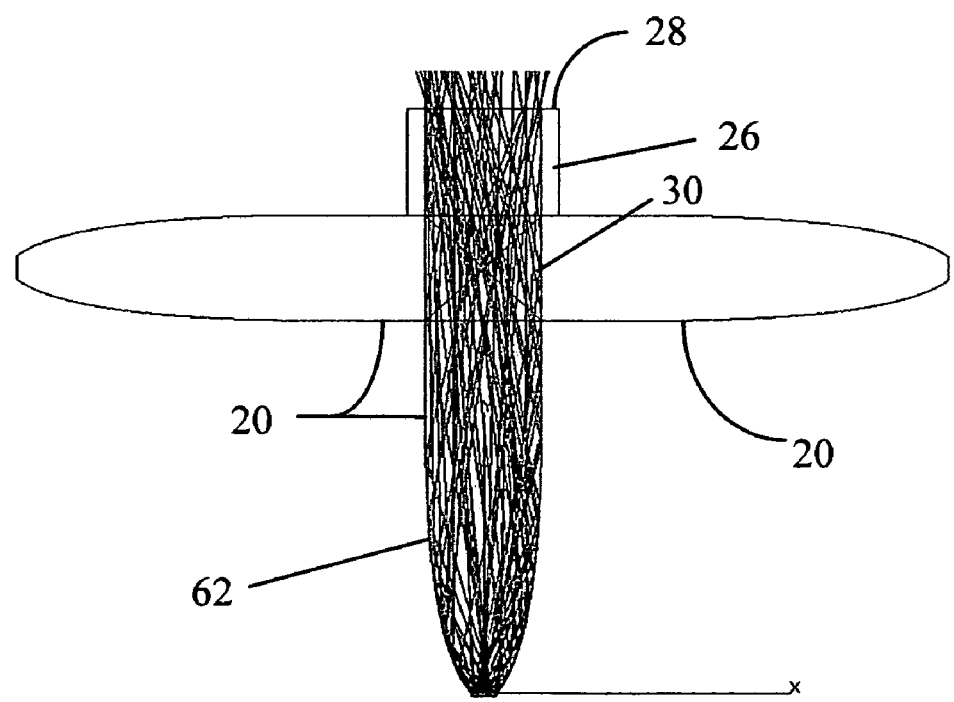
FIG. 4 is a diagrammatic plan view showing a raytrace of the system of FIG. 2 for the straight through case.

A ray trace carried out with TRACEPRO optical modeling software is shown in FIG. 4 for the LED source directly opposite the light source 12's exit aperture 28. The rays reflected from the wall 62 of the CPC collector 20 are shown to be confined to the X-Cube 30 and thus guided to the entrance aperture 28 of light homogenizer 26. The coatings of the X-Cube 30 are made to transmit the wavelength directed straight though it, i.e. from the vertically oriented CPC of FIG. 4.

Figure 5:
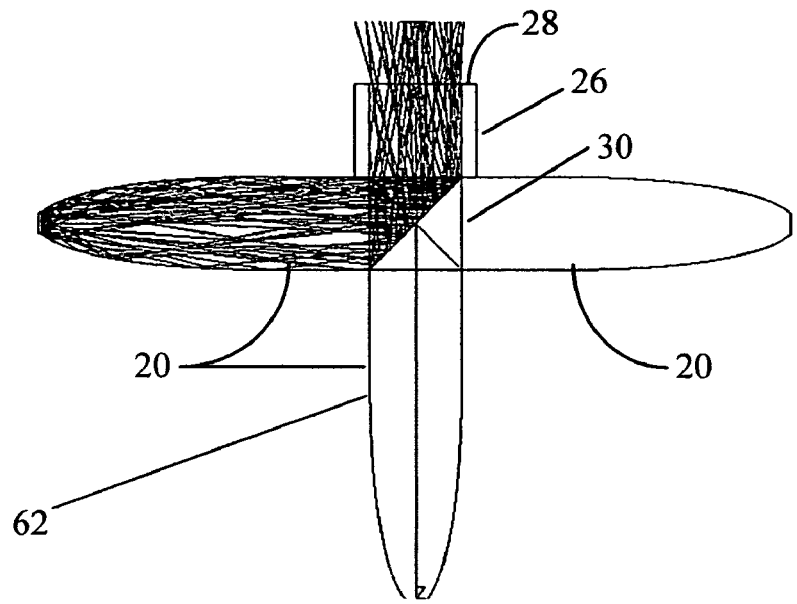
FIG. 5 is a diagrammatic plan view showing a raytrace of the system of FIG. 2 for one of the orthogonal cases.

Similarly, FIG. 5 shows the output from the LED source and CPC collector 20 on the left reflecting off the dielectric coating of the X-Cube 30 toward the aperture 28. This light is also confined to the light piping X-Cube 30. The X-Cube 30 of the invention offers a much more compact system relative to a standard X-Cube configuration, which would have to be significantly larger to accommodate diverging beams. This reduces overall system cost and size.

Figure 6:
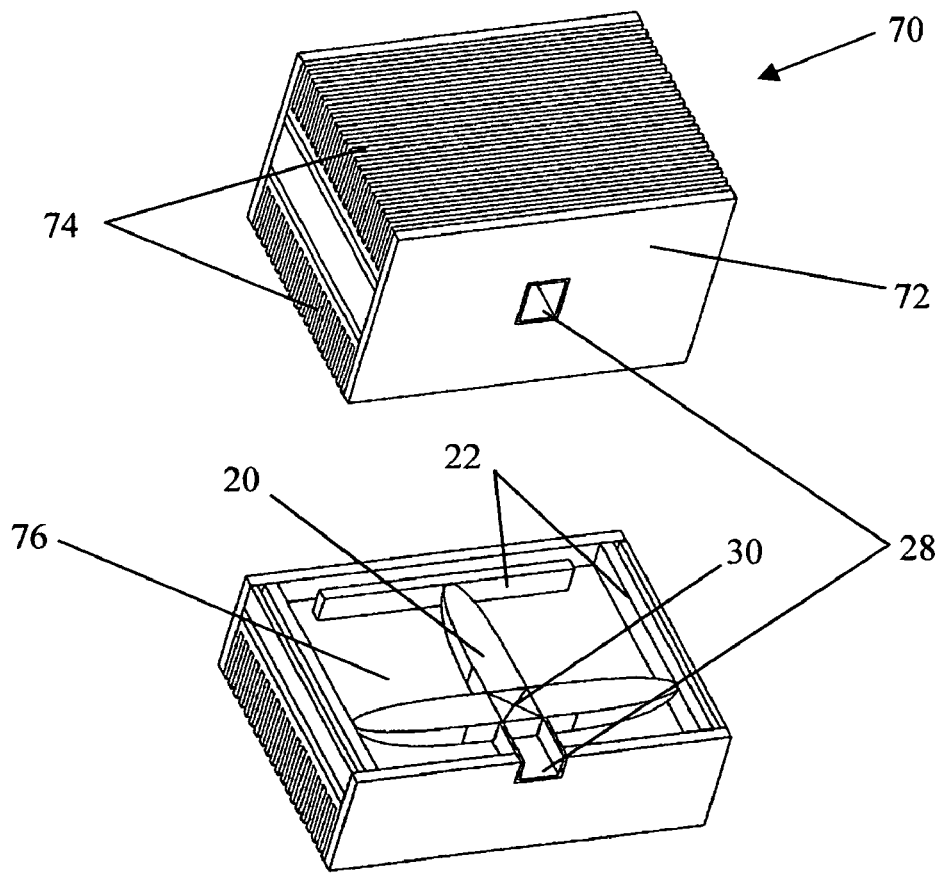
FIG. 6 is an exploded diagrammatic perspective view showing the system of FIG. 2 interfaced to heat sinking and packaged.

Reference is now made to FIG. 6 the upper portion of which shows a diagrammatic perspective of a complete LED projection source module 70 and its cross section in the bottom portion of the figure. LED boards 22 are thermally attached by soldering, brazing, thermal grease, or the like, to a heat spreader 76, which sandwiches the optics lying both on top and below the plane of the CPC collector optics 20. The heat spreader 76 is preferably a material of high thermal conductivity, such as copper, aluminum, diamond, composite material such as embedded graphite, or a heat pipe. If a heat pipe, the type incorporating capillary tubes would provide operation in any orientation as opposed to the type that uses wick structures. Heat sinks 74 allow for convective or forced air cooling, depending on operating conditions. Faceplate 72 covers the front, exposing only the output aperture 28.

Recent developments in methods for increasing external quantum efficiency for LEDs has led to very high extraction efficiencies even in the absence of refractive index matching as discussed above. Previous to the use of these methods, such as surface roughening, microlens arrays, micro-prism arrays, angle faceting, photonic lattices, etc., the cubic geometry of LEDs resulted in entrapment of light within the LED die due to total internal reflection (TIR). External quantum efficiency was improved by approximately the square of the index of refraction of an encapsulating material for defeating the TIR. Historically, LEDs, thus, benefited by encapsulation. These recent improvements in LEDs incorporating features for increasing external quantum efficiency get proportionally less benefit from encapsulation. Therefore, variants for coupling the outputs of such improved LEDs to CPCs to match the étendue of DMDs or the like are provided to take advantage of the higher available output from such LEDs.

As is known, étendue fundamentally limits the optical power that can be imaged through a digital micro-mirror (DMD) or liquid crystal on silicon (LCOS) device and is given by the product of the device area, its limiting solid angle of acceptance, and the square of the index of refraction of the medium. Typically, the modulation devices are used in air and typically they have a 12-degree half angle of acceptance, at least in one azimuth. Thus, for the higher performing devices, it is better to design an LED projection system with air as the medium between the LED die and the collection optic by employing a hollow reflective collection optic, for example, and thus benefiting from the étendue invariant resulting in a larger effective LED die size and thus higher available optical power. The benefit of not using the index matching is thus about a factor of 2 in brightness for a fixed exit aperture area for an ideal die that does not increase its output significantly by index matching due to incorporation of features to increase external quantum efficiency. Thus, a hollow reflector results in about a 2× advantage over a dielectric filled reflector for an ideal die. In practice, the LEDs are not yet ideal, so the benefit will be less than 2×, but can still be significant. For example, the new CREE EZ900 die increases its output by only about 20% when encapsulated. Thus, there is a net increase in luminous emittance (for a fixed LED die current density) of 160% by using an ideal hollow reflector. The somewhat older CREE XB and XT LED die configurations, however, still increase in luminous emittance on the order of 2× when index matched with a typical 1.5 index of refraction encapsulant. Thus, these devices are far from ideal. But, for the EZ CREE die, it is beneficial to use a hollow reflector. It should be pointed out, that the use of the hollow reflector with the EZ1000 die does come at a price, in that the input power will be 2× over that of a dielectric filled reflector, but this is a welcomed trade off in order to achieve higher on-screen brightness.

The efficiency of larger die is generally greater than for smaller die. For example, the CREE EZ1000 die is nearly twice as efficient as the equivalent area of EZ90 die. The reason for this is related to the fact that the dead space between the electrode and the edge of the die is proportionally less for the larger die. Additionally, the space required for the bond pad in the larger die is proportionally much less, as the bond pad dimension for the large and small die are similar in dimension. The increased efficiency of the large die is particularly true for the true top emitting devices that use the epitaxial lift-off method. These devices, such as the UEC (Epistar) red die and the CREE EZ-type die are no longer bulk emitters. Thus, they do not suffer from increased internal absorption within a larger bulk emitter, as would the CREE XB900 die, for example. Thus, it is generally much better to use larger die for the most recent top emitting LEDs. It is also much easier to wire bond and die attach the larger format die which translates into increased reliability and lower system cost.

Figure 7:
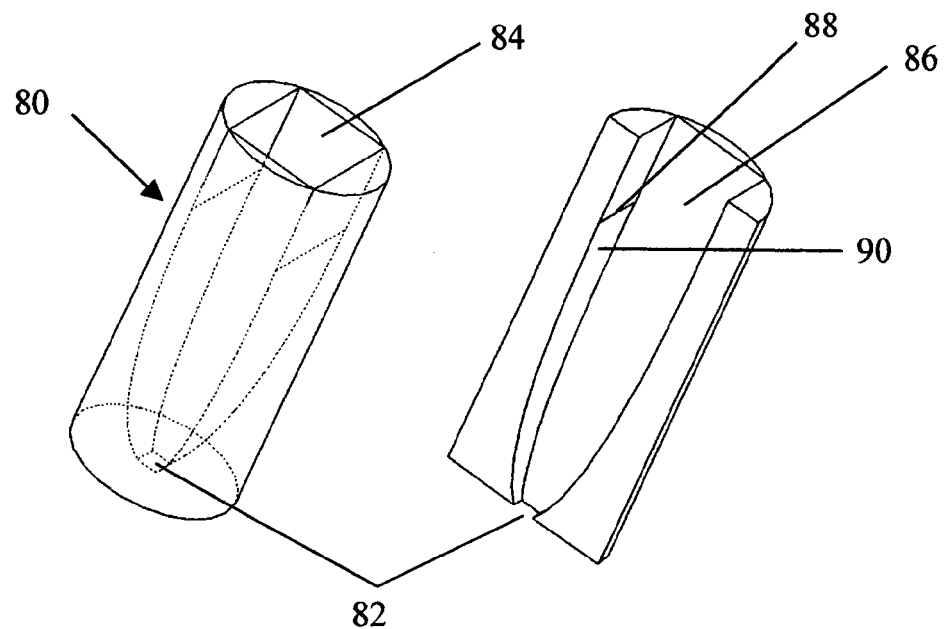
FIG. 7 is a diagrammatic perspective view of a hollow rectangular CPC and a section view thereof.

Theoretically, 96% of the light entering the input aperture of a circular cross section compound parabolic concentrator will exit the output aperture within the design angle, thus making it a very nearly a perfect concentrator. The apertures of light modulation devices, however, such as digital micro-mirror devices (DMD) and liquid crystal on silicon (LCOS) are typically rectangular. Thus, if a circular cross section concentrator were used, there would be a mismatch in area. For example, if an XGA format modulator is used and a circular cross section concentrator is employed with the XGA aperture inscribed, then approximately 40% of the light would be wasted, as it would not enter the rectangular aperture. This would lead to additional heat and wasted power. Assuming finite heat dissipation, this would lead to higher die temperature leading to both reduced performance and life. An alternative approach is to use a concentrator with a rectangular cross section. Such a concentrator can also make use of two different specification compound parabolic concentrators (assuming an aspect ratio different than 1:1) such that the exiting angle is the same nominal angle in both axes. This leads to different effective lengths of the rectangular CPCs in the two axes. However, the shorter length device can be extended with parallel walls to make one composite concentrator as shown in FIGS. 3 and 7. Here, the skew rays that go toward the diagonals result in only about 87% of the light being confined to the design angle. However, this is a reasonable trade-off, as it results in reduced die area (with lower associated cost) and lower die junction temperature for a given luminous emittance. The shape of the concentrator could be approximated by other shapes including facets, multiple spline fits, or higher order polynomials, or the like.

The circularly symmetric compound parabolic concentrator described above was derived from the edge ray principal of non-imaging optics and has been shown to have near ideal performance (High Collection Nonimaging Optics, W. T. Welford and R. Winston, Academic Press, 1989). There are other shapes, however, that can lead to similar far and near field performance, such as compound elliptical (CEC) and compound hyperbolic (CHC) concentrators. In particular, the compound hyperbolic concentrator in conjunction with a field lens at its output aperture can be shown to have near and far field performance significantly similar to that of the CPC, but with a much shorter length. This CHC/field lens design and derivatives thereof can result in near ideal concentrators with a much shorter length relative to a standard CPC. This is particularly useful for low numerical aperture devices for which the CPC can get very long. These types of optics are particularly useful in conjunction with LED die or die arrays. In order to achieve uniformity in the near and far fields and to preserve the maximum étendue, it is important that the input aperture of the optic be substantially filled. Projection systems are inherently limited in throughput by the device étendue, so preserving it throughout the system is critical to achieving optimal performance. FIG. 7 shows a hollow reflective CPC 80 with an input aperture 82 of non-equal length and width. The shorter dimension has a proportionally shorter length CPC profile 90 in its associated axis. Parallel sides 88 tangent to the exit of the shorter CPC 90 extend to the length of the longer CPC 86. In this way, both axes are designed to have the same exit angle, thereby producing a symmetric far field.

Figure 8A:
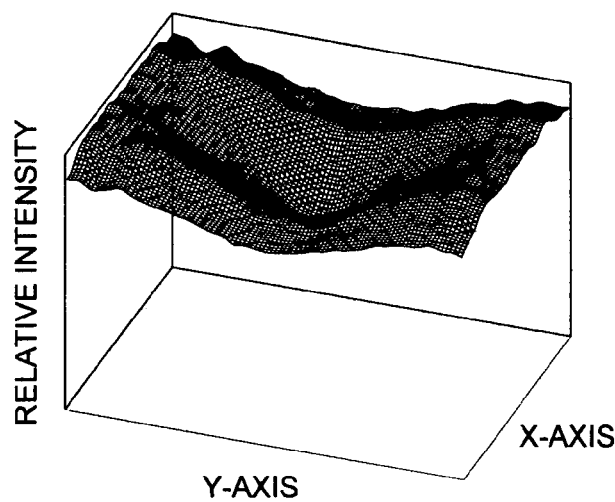
FIG. 8A is a three-dimensional plot showing the near field intensity distribution of the rectangular CPC of FIG. 3.
Figure 8B:
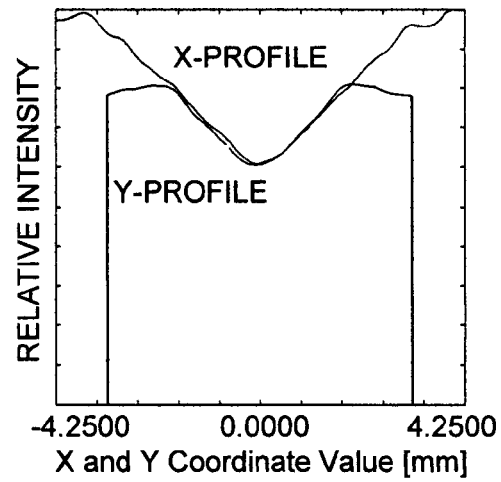
FIG. 8B is a two-dimensional plot showing the variation of intensity taken along orthogonal axes in FIG. 8A.

FIG. 8A shows a three-dimensional plot of the near field distribution typical of a dielectric or hollow rectangular CPC indicating higher flux near the edges. FIG. 8B shows two-dimensional plots of the variation along orthogonal X and Y axes taken through the center of the topographical plot of FIG. 8A. The higher flux toward the edges can be used to advantage by counteracting the fall off in on-screen brightness toward the edges of the field, which is typical on-screen loss due to the cos θ roll-off of typically wide-angle projection optics 16 of FIG. 1. The dielectric filled CPC of FIG. 3 would have similar far field characteristics.

In contrast to the circular cross section CPC, the rectangular cross section CPC of FIG. 7 maintains about 88% of the light within the designed far field angle as shown in FIGS. 9A and 9B. FIG. 9A shows the full far field from a rectangular CPC. FIG. 9B represents the light within the design angle (20 degrees in this case), which passes through the circularly symmetric stop 40 of the projection lens 16 of FIG. 1. This square far field distribution is due to the effect of the skew rays reflecting from the vicinity of the diagonals. Even so, this device is much less wasteful with respect to matching the input aperture of the rectangular modulation device, which more than makes up for this loss. Alternatively, the projection optics can be designed to accommodate the rectangular far field, which would increase the on-screen brightness at the expense of somewhat larger lenses.

Modulation devices such as the Texas Instruments DMD typically have a limited mirror deflection angle of 12 degrees. The conventional wisdom is that this limits the angle of the illumination to 12 degrees or there will be overlap between illumination and projection beam paths. This is only true, however, in the plane of the mirror tilt. It is feasible to use a larger cone angle in the orthogonal direction. Thus, an asymmetric far field allows the total system throughput, and thus on-screen intensity, to be increased beyond that of conventional wisdom. For example, the on-screen intensity can be increased by a factor of 2 by using an f/1.2 cone in the axis orthogonal to the mirror tilt plane. The source, illumination optics 14 and projection optics 16 of FIG. 1, would all have to match this condition. The use of aspheric elements, which essentially come for free if plastic lenses are used, would help balance increased aberrations due to the lower f/# system.

FIG. 10A shows a dielectric rectangular CPC 100 with an asymmetric distribution in the far field. As mentioned above, modulation devices such as the Texas Instruments DMD typically have a limited mirror deflection angle of 12 degrees. The output aperture 110 is matched to the dimensions of the DMD. The input dimensions, however, are increased in one axis to produce the far field distribution shown in FIG. 10B, which results in a 100% increase in on-screen brightness. This is a significant benefit in performance. It would allow an LED based system to work significantly better than the limits of conventional teachings.

Figure 11A:
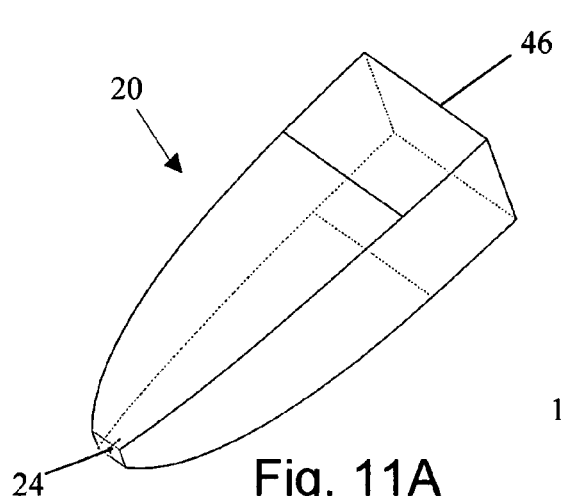
FIGS. 11A and 11B are diagrammatic perspective views comparing, respectively, a full rectangular CPC with a theta by theta rectangular CPC, which collects less than the full angular distribution of a Lambertian source of increased dimension.
Figure 11B:
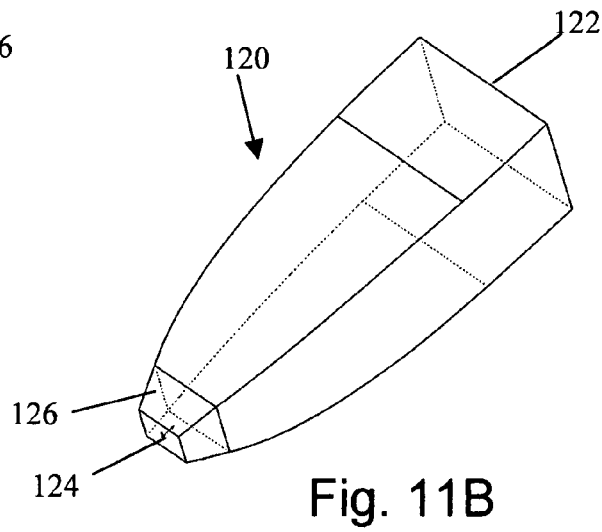

FIGS. 11A and 11B, show, respectively, a comparison between a rectangular aperture CPC designed to capture the full 2π steradian output of an LED emitter and one designed to capture light emitted up to some finite angle less than the full hemisphere. This can be accomplished by use of a theta by theta (θ by θ) CPC as described in general form by Welford and Winston, but extended to the case of a rectangular CPC. Section 126 of CPC 120 in FIG. 11B represents a straight section tangent to the parabolic profile at the interface. The result is an increase in input aperture size which results in increased luminous emittance from aperture 124 of FIG. 11B relative to aperture 24 of CPC 20 shown in FIG. 11A. Effectively, the light that enters aperture 124 at angles further from the LED die normal than the design cone angle of section 126 are coupled into exit angles greater than the design angle. Those skilled in the art will recognize that use of a circular conical section similar to section 126 can be readily used with a rotationally symmetric CPC section to provide a solid collector optic with performance substantially the same as that of a hollow rotationally symmetric collector optic where the LED is not index matched.

Figure 12:
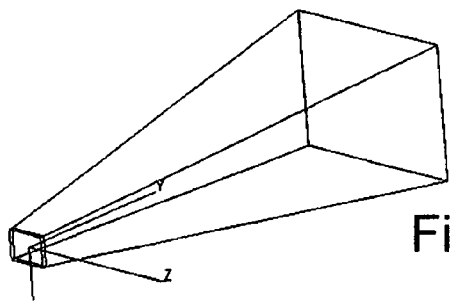
FIG. 12 is a straight tapered concentrator for the purpose of comparing the performance to the rectangular CPC of FIG. 3.
Figure 13A:
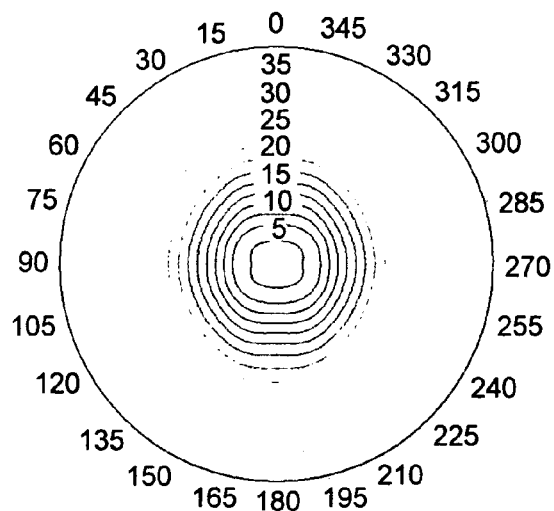
FIGS. 13A and 13B show the far field distribution of the tapered concentrator of FIG. 12.
Figure 13B:
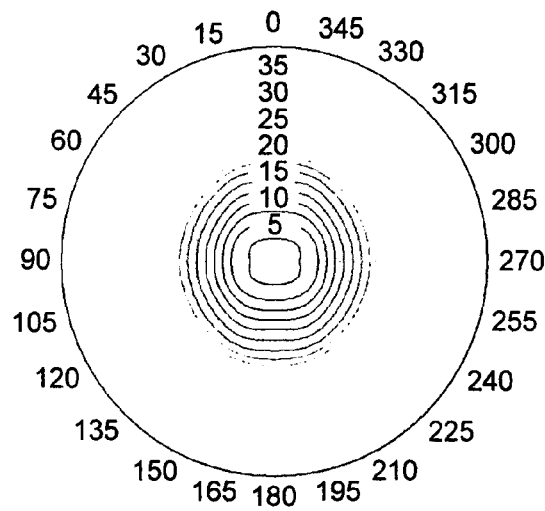

FIG. 12 shows a straight taper with the same input and output aperture dimensions as the rectangular CPC 20 of FIG. 4 of equivalent length. FIG. 13A shows that the far field distribution for the taper is not well constrained to the 20-degree design angle in comparison with that of the CPC 20. Only 67% of the light passes through the aperture stop 40 of the projection lens 16 within the 20 degrees as indicated in FIG. 13B. Thus, a rectangular CPC is shown to have more than 30% better performance relative to a straight taper of equivalent length.

Figure 14:
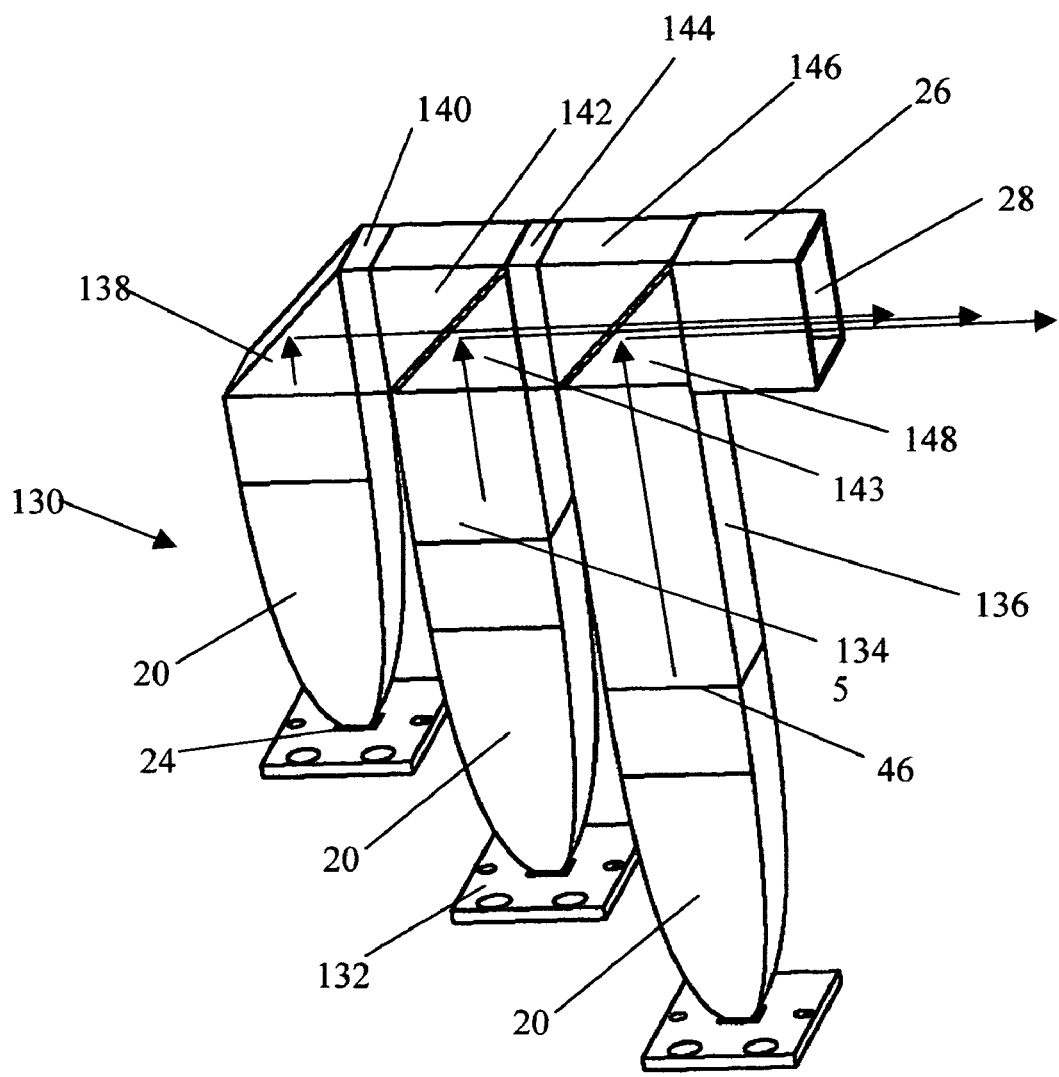
FIG. 14 is a diagrammatic perspective view of alternative embodiment of the invention that may be used as the LED source of FIG. 2.

FIG. 14 shows an alternative coupling embodiment 130 of the LED projection source of FIG. 2 wherein common elements retain their original identification. Here, LED die or die arrays are attached to high thermally conductive boards 132 (typical) and coupled into input apertures 24 of CPCs 20, which can be either solid or hollow, with or without a conical input section. The output of the leftmost CPC 20 enters into a light guiding prism 138. The light is reflected through 90 degrees by the hypotenuse of 138, which is coated with a high reflectivity coating. As was the case for the prism 30 of FIG. 2, the prisms and rectangular glass sections 138, 140, 142, 143, 144, 146, 148, 134, and 136 use TIR to light pipe the light within their input dimensions so as to maintain the compact size with its inherent packaging and cost advantages. The total optical path between the exit aperture 46 of each of the three colors of LED source CPCs 20 and the output aperture 28 are substantially the same due to light pipes 134 and 136 so as to maintain similar near field intensity patterns and degrees of light homogenization. It is important that the space between the leftmost CPC 20 and the prism 138 and the space between prism 138 and solid rectangular light pipe section 140 be either air, or an index medium sufficiently small to assure TIR of the light from leftmost CPC 20 is constrained to the prism 138 prior to reflecting off its reflective hypotenuse and is constrained to the prism after reflecting off the hypotenuse. Otherwise, some of the light exiting CPC 20 would be transmitted through the top surface of 140 and 142 or would re-enter the CPC 20 and would not be maintained at the limiting angular extent from the CPC 20. The same requirement holds true for prism 143 of the center CPC and rectangular light pipe 144. This would also be true for prism 148 and homogenizer 26, if 26 were solid rather than hollow. The light guiding X-Cube 30 of FIG. 2 is replaced in the embodiment of FIG. 14 by two separate dichroic wavelength dependant reflective coatings placed between prisms 142 and 143 for the center CPC and prisms 146 and 148 for the CPC on the right closest to the output aperture 28. The specific arrangement of red, green, and blue LED sources (or other colors) is not critical as long as the dichroic coatings are appropriately designed to transmit or reflect as required. Alternatively, the CPCs 20 do not have to be pointing in the same direction or in the same plane. They can be placed opposite or orthogonal to each other if desired for space and thermal considerations. Likewise, prism 138 could be eliminated so that the leftmost CPC would enter directly into prism 142, thereby eliminating prism 138 and light pipe 140, as well as decreasing the length requirements of light pipes 134 and 136. Additionally, phosphors or other wavelength converting elements can be employed over the LED die to result in wavelengths and spectral bandwidths not readily available from standard LED die. For example, green LED light can be produced from the combination of blue LED excitation and green phosphor, which more closely matches the peak of the human eye's photopic response curve shown in FIG. 33.

Figure 15A:
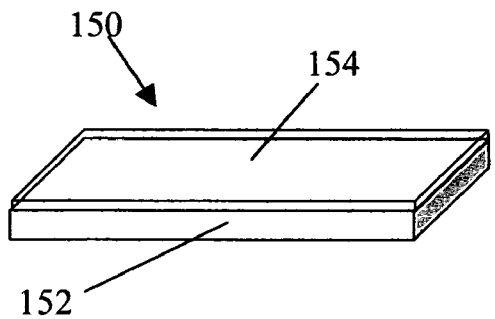
FIGS. 15A and 15B show diagrammatic isometric and cross sectional views, respectively, of an LED die with a thin conformal encapsulant for the purpose of extracting more LED light.
Figure 15B:
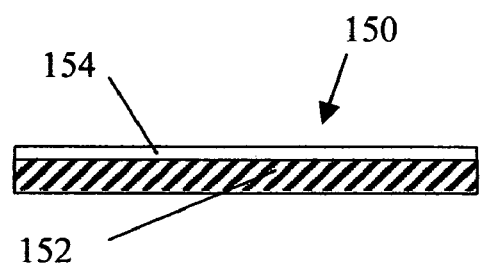

The benefits of using a hollow CPC collection optic were described above, but these only work well for LEDs for which the benefit in increased extraction efficiency by index matching is not that significant. A method for extracting more light from an LED die system 150 is shown in FIGS. 15A and 15B for which the bare LED die, designated generally at 152 is conformally encapsulated with a low absorption medium 154, such as silicone with an index of refraction greater than unity (1.5 is typical). The light, which is able to exit the LED 152 into the encapsulant 154, is subsequently partially totally internally reflected (TIR) at the encapsulant-air interface. The LED emittance, which is prevented from leaving the encapsulant 154 into the air by TIR, is then reflected back to the die surface. For LED diffuse reflectivity in excess of about 50%, there is a net increase in light extracted into air as a portion of the light that impinges back on the LED surface that is diffusely reflected within the angle space that would be transmitted through the encapsulant-air interface. Thus, the increased light extracted into the index-matching medium can be effectively coupled in the forward direction, i.e., recycled. As an example, for a diffuse LED reflectance of 60% and an encapsulant index of refraction of 1.5, there is an increase in light extraction into air of approximately 20% above that which would otherwise occur in the absence of the encapsulant. The layer need only be 10s of microns thick and thus would act as a conformal coating. This approach increases the effective benefit from the use of hollow reflectors depicted in FIG. 7.

Reference is now made to FIGS. 16A and 16B which show an alternative embodiment 160 of a rectangular CPC for which the shape of the collection optic between the horizontal and vertical axes of the CPC of FIG. 3 are substantially the form of a CPC that vary continuously lengthwise (i.e. in meridonal planes passing through the surface and optical axis) from the vertical to horizontal. The points represented by 166, 168, 170, and 172 are all end points of differently shaped profiles but each of CPC form. Thus, at angles in a direction along the diagonals, passing through CPC end point 166, for example, and angles in between the horizontal and vertical CPC end points 170 and 172, represented by CPC end point 166, the form is still that of a CPC. This results in an optic that deviates from the simple rectangular cross section of the CPC of FIG. 3, that yields a substantially circular rather than rectangular far field. Thus, the compound CPCs of FIGS. 16A and 16B result in a rectangular near field and a substantially circular far field, which would increase the on-screen brightness from that of FIG. 3 by the order of 10%. This approach can have either a solid or hollow optic form.

FIGS. 17A and 17B show a solid CPC 180 of the form of FIG. 11B, with the addition of a premixing homogenizer 198 that is placed between an LED die or die array and the CPC entrance aperture 184. This rectangular cross section light pipe or homogenizer 198 matches the dimensions of the entrance aperture 184 of the CPC 180. The rays shown in FIG. 17B show that this configuration can be used with or without an index matching medium between the LED 196 and the input aperture 186. Here again, the benefit of a hollow CPC can be realized by the use of a solid CPC terminated by a conical section 188 as shown in FIG. 17A to effectively open the entrance aperture 184 up to that which can be realized with a hollow CPC. In effect, this is a hybrid design consisting of a CPC altered at the entrance end by the provision of a conical section that blends with the CPC profile.

This may be understood from the following. The basic form of a solid, air spaced CPC is designed assuming index matching. But, due to refraction of the rays exiting the LED source 196 in the vicinity of 194 (See FIG. 17B), the rays have an extent much less than that of a hemisphere within the dielectric medium of the CPC 180. Thus, the output angle for an unaltered CPC of this form not index matched is less than the design angle. By altering the CPC with a blended conical section 188, the angles are spread such that the increased angle for the larger input dimensions now fill the desired angle space. In designing such a hybrid collector 180, the downstream requirements on angle and dimensions are used to design a solid CPC of dielectric material to arrive at the dimensions for the input aperture size and geometry. Ordinarily, these dimensions are smaller than for a corresponding hollow design with the same downstream requirements on angle and size. But, because the benefits of a larger LED are desired for the solid design, its entrance aperture are modified to accommodate a larger LED which is air spaced from the entrance surface. Then, a straight line is drawn from the edge of the otherwise larger LED so that it intersects the CPC profile at points of tangency (See 190 in FIG. 17A). The result is a solid hybrid collector design that mimics the performance of a hollow one by exploiting the benefits of LED air spacing and otherwise larger size.

The homogenization effect of 198 improves the output uniformity for real LED die, which do not have a uniform spatial output due to the presence of electrodes and wire bonds. It also minimizes the effect of tolerances between the LED die and the input or entrance aperture 186 by mixing the light prior to entering the input aperture 184 of the CPC 180. This optic, the CPC and homogenizer 198 can readily be molded as one piece. Another advantage of a non-index matched solid collection optic over that of the hollow CPC of FIG. 7 is that no reflective coating is required and the bottom of the CPC does not interfere dimensionally with the wire bonds. The Fresnel loss at the input aperture 186 for the non-index matched case is offset by the reflective loss experienced by practical reflective coatings that must be deposited on hollow CPCs.

Figure 18:
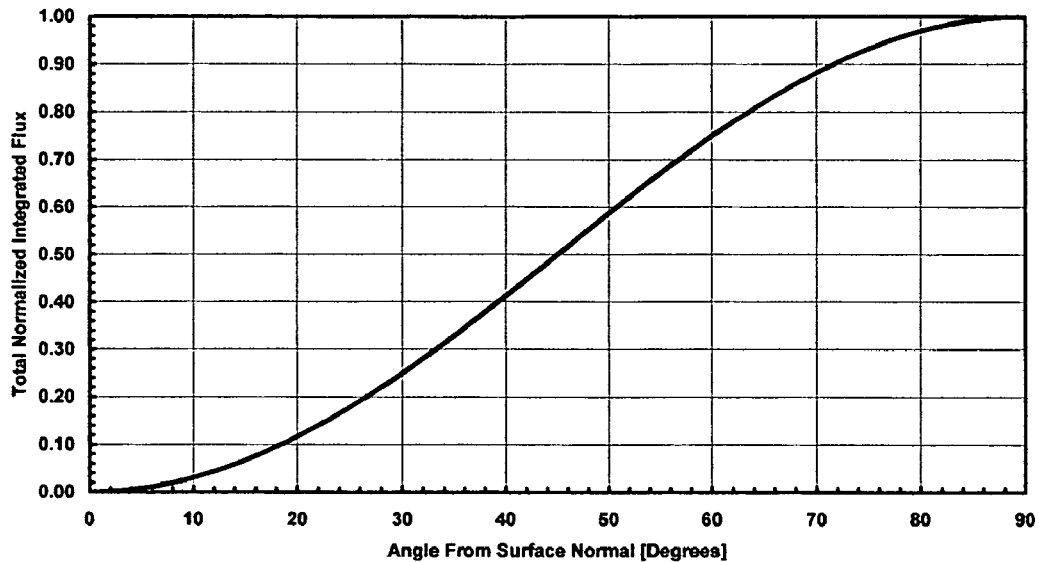
FIG. 18 is a plot of the total integrated power for a Lambertian source as a function of the collection angle.

The benefits of the hybrid collector of FIG. 17A may be more fully appreciated by understanding the effects of use of the blended conical section 188. As described above, the standard circular or rectangular CPC takes the energy emitted from a source over a hemisphere ($2\pi$ steradians) and uses the edge ray principle of Welford and Winston to form a reflector for which the energy is emitted at a specific design angle with near ideal efficiency. The output of a typical LED die is substantially Lambertian; that is, the emitted flux falls off as the cosine of the angle from the surface normal and the total emitted flux is proportional to the integrated square of the cosine of the included angle from the surface normal as shown in FIG. 18. Thus, the angles far from the surface normal contribute very little to the total integrated flux.

Figure 19:
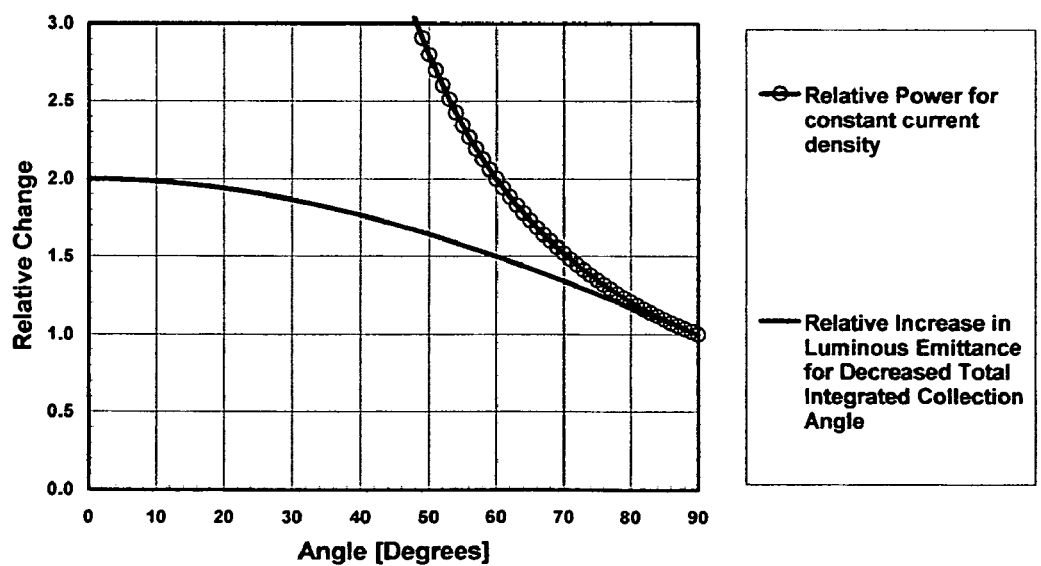
FIG. 19 is a plot showing the increase in luminous emittance for constant étendue as a function of collection angle and also indicates the associated increase in drive power to the LED.

FIG. 19 shows that the luminous emittance from a non-imaging collector can be increased by excluding the higher angles for which there is proportionally less flux. This assumes a constant étendue such that the decrease in solid angle results in a proportional increase in emitting source area (for a constant current density). This benefit from the increased area increases faster than the loss in collected flux from excluding the higher angles. The increase in area, however, does result in an increased relative input power. The relative power curve has a knee in the vicinity of 60 degrees, which would correspond to a 50% increase in the luminous emittance from the collector. The design of the collection optic would be a $\theta$ by $\theta$ concentrator, as described by Welford and Winston for which the modified CPC 180 of FIG. 17A is made tangent to a straight cone at a specific design angle, but extended to the case of a rectangular CPCs of the forms shown in FIGS. 3, 7, 10A, 11A, and 11B. The 60 degree included angle design point is a reasonable tradeoff between the non-linearly increasing power and the asymptotic increase in luminous emittance.

FIGS. 20 through 27 represent alternative embodiments for coupling the typically red, green, and blue light from their respective collection optics to a common beam that can be imaged onto the DMD modulator 36, or the like.

Figure 20:
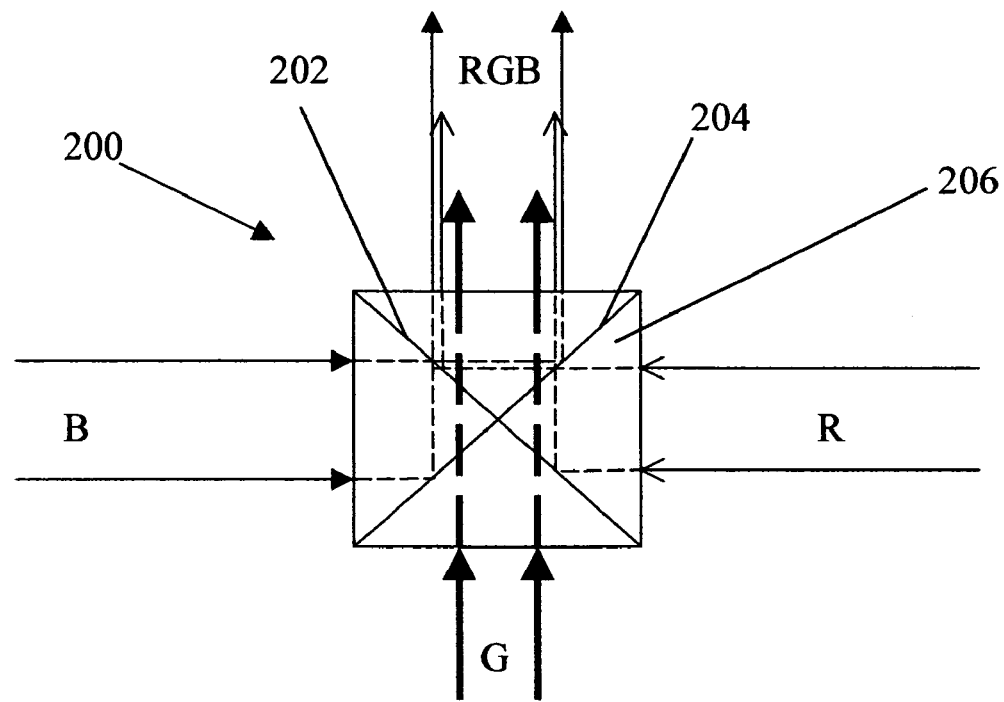
FIG. 20 is a diagrammatic plan view of an X-Cube beam coupling system for producing a white light output.

Reference is now made to FIG. 20 which diagrammatically shows an X-Cube design 200 for which the green wavelengths are typically transmitted through the cube unaltered in direction and the red and blue are reflected off their respective surfaces 202 and 204 toward the output face. This general approach has been used in the past, but not with the additional requirement of light piping for reduced size. The system of FIG. 3 is a modification of this basic approach, but is much more compact and therefore of lower production cost.

Figure 21:
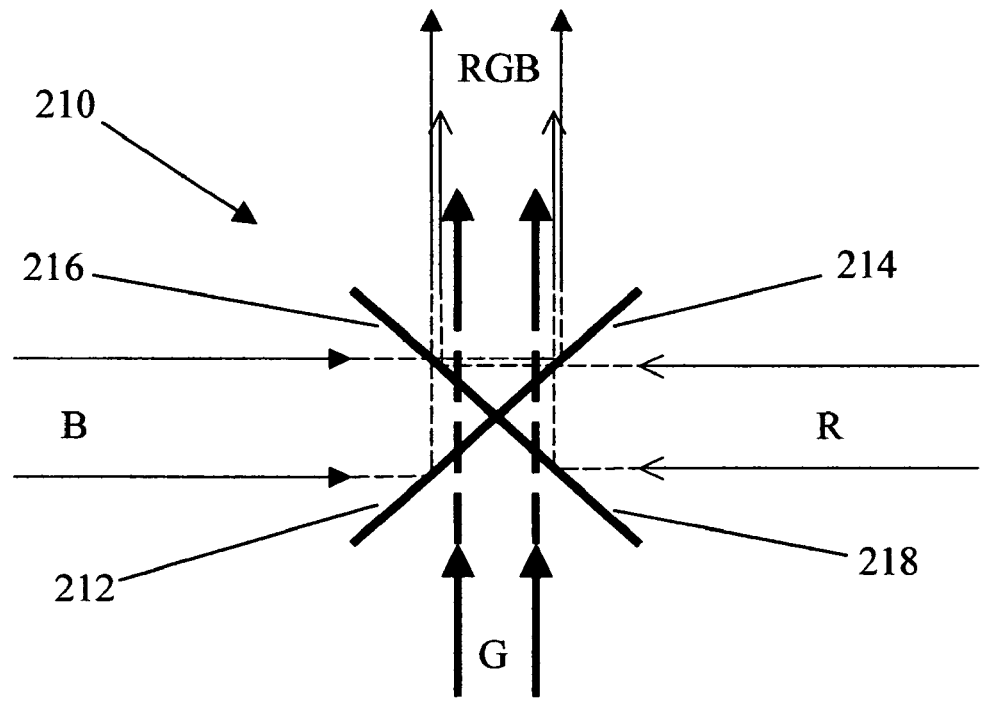
FIG. 21 is a diagrammatic plan view of an X-Plate beam coupling system for producing a white light output.

FIG. 21 shows a variation of the X-Cube in the form of an X-Plate 210 comprising four separate plate dichroic beam splitters 212, 214, 216, and 218, that are configured to redirect the different color beams in much the same way as the X-Cube of FIG. 20.

Figure 22:
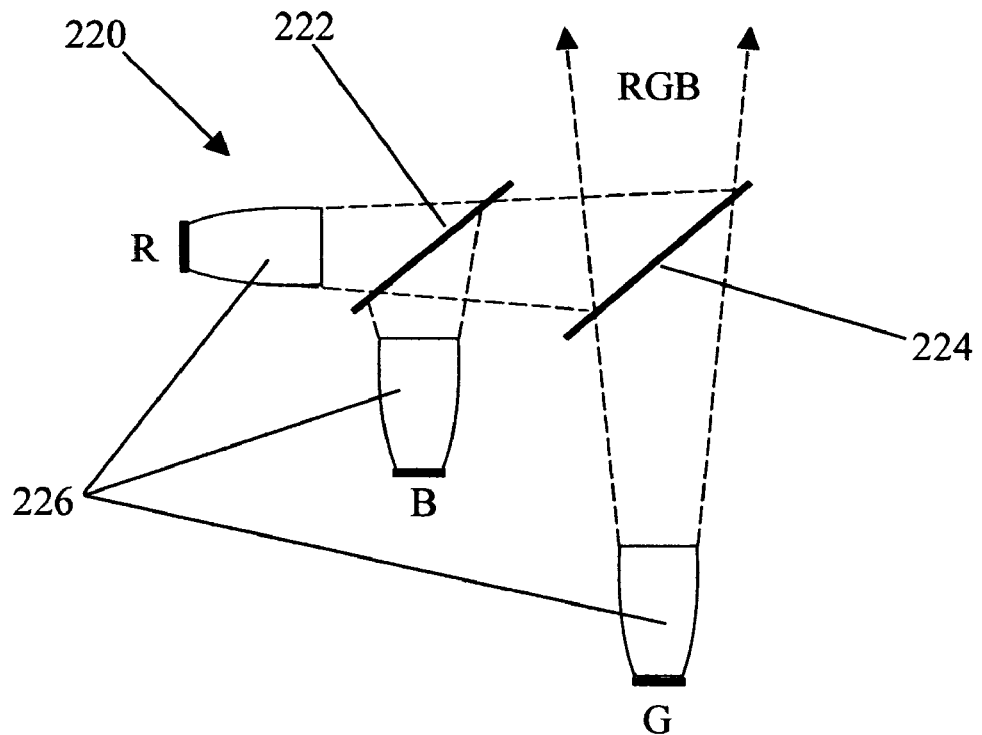
FIG. 22 is a diagrammatic plan view of a beam coupling system using 2 standard dichroic beam splitters in conjunction with RGB sources to generate a white light output.

An alternative coupling system to the X-Cube and X-Plate is shown in FIG. 22 at 220 and is likely to be of lower complexity and cost. As shown, there are three CPCs 226 that generate R, G, and B beams and two beam splitters 222 and 224. The distance of the green CPC 226 from its respective beam splitter 224 is greater than that of the other two so as to equalize the paths. A method for reducing the complexity of the relay system 14 of FIG. 1 is to adjust the relative optical path differences between the exit aperture of the LED illumination source 28 in FIG. 1 such that all color sources will overlap at the plane of the DMD 36 for a monochromatic relay. This reduced complexity of the relay, which would then not require further achromatization would represent a cost savings. This same approach can be used in the system of FIG. 22.

Figure 23:
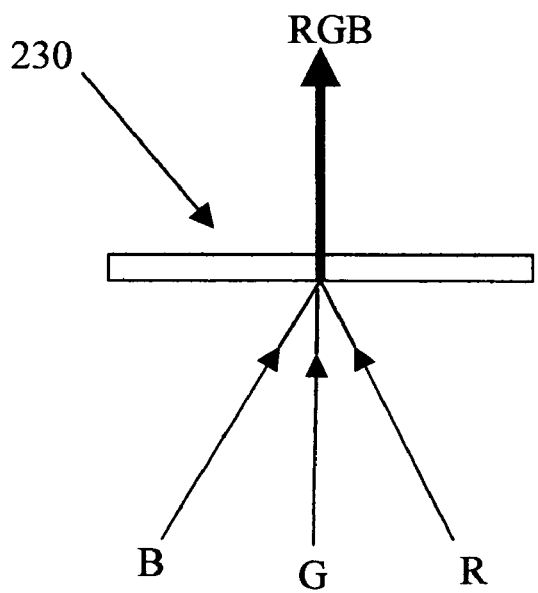
FIG. 23 is a diagrammatic plan view of a transmission grating coupler for an RGB LED projection source.

Referring now to FIG. 23, there is shown a beam combiner element 230 with a wavelength dependant transmission that varies with angle. This can be accomplished by use of a transmission grating, for example, for which the green wavelength can be transmitted with little deviation surrounded by the blue and red beams, which are deflected through appropriate angles. Alternatively, element 230 can be an acousto-optic modulator or a 2 or 3-glass prism. The 2-glass prism would introduce a deflection of all angles, where the 3-glass prism can be designed for zero deflection at the central wave band. There are limitations on the throughput from the grating efficiency, and the spectral spread, but this can represent a very compact method of beam combining.

FIGS. 24A and B and FIGS. 25A, B, and C depict methods of beam splitting that are particularly relevant to the color sequential requirements of a single DMD projection system. As shown in FIG. 24A, a beam splitter 240 comprises two separable right angle prism halves 244. The prism halves 244 can be readily moved away from one another so as to create a gap between them at their common hypotenuse to destroy the optical contact between them along this interface. The distance between the prisms 244 is made on the order of several to 10's of microns as diagrammatically shown in the configuration of FIG. 24B, which acts to reflect, say, a red and blue combined beam in the direction of the combined output at a 90 degree deflection angle. The configuration of FIG. 24A represents the case where the two prisms are brought into optical contact, that is within the order of a micron separation or less. This approach is based on the principal of frustrated total internal reflection for which the light is transmitted through the interface between the two prisms in the case where the faces are within the evanescent tail of the electromagnetic field of the light exiting the first prism half and entering the second. The separation is preferably modulated by piezo-electric stack modulators that have the property of expanding or contracting as a function of drive voltage. This would typically be used in three positions within one plane for appropriate balance. If the devices need to be modulated quickly and air between the prisms becomes a limiting factor, the device could be placed within a hermetic package with air evacuated.

FIGS. 25A, B, and C show a three position device 250 similar to that of FIG. 2, but comprising 4 right angle prisms as shown. The prisms would be actuated as shown to transmit or reflect light from left or right sides as required. The transmission efficiency would be in the high 90's % as the only significant losses would be due to Fresnel losses and good anti-reflection coatings are used to make transmission efficiency close to 100%. FIG. 25A corresponds to no gap to transmit green, FIG. 25B to a gap 256 to transmit blue, and FIG. 25C to a gap 258 to transmit red.

Figure 26:
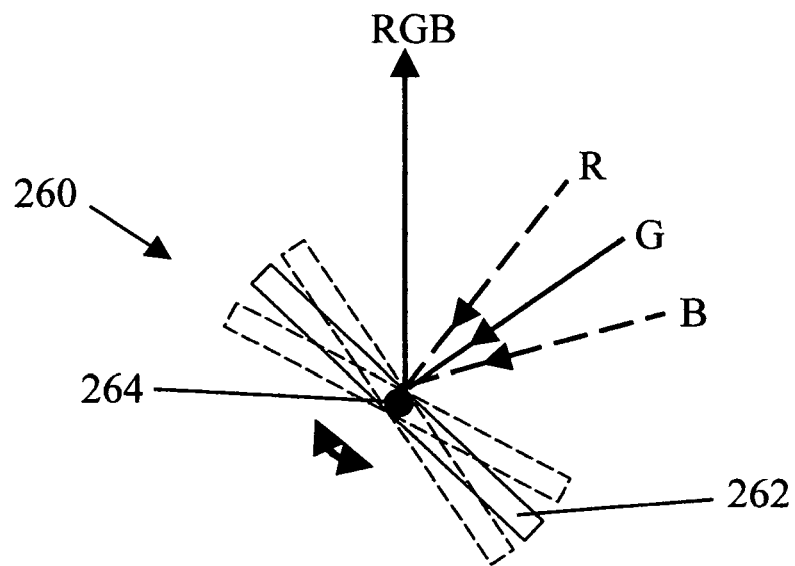
FIG. 26 is a diagrammatic view of a galvanometric actuated mirror for color sequential coupling of two or more color LED source beams.

Reference is now made to FIG. 26 which shows a tilting mirror 260 actuated by a galvanometer or servo motor about a central axis 264. The angular modulation of mirror 260 is arranged to quickly adjust its angle so as to couple light from LEDs of several colors in sequence, which is ideal for a color sequential system. The galvanometers can operate on sub-millisecond time scales, which are well suited to LED projection systems.

Figure 27:
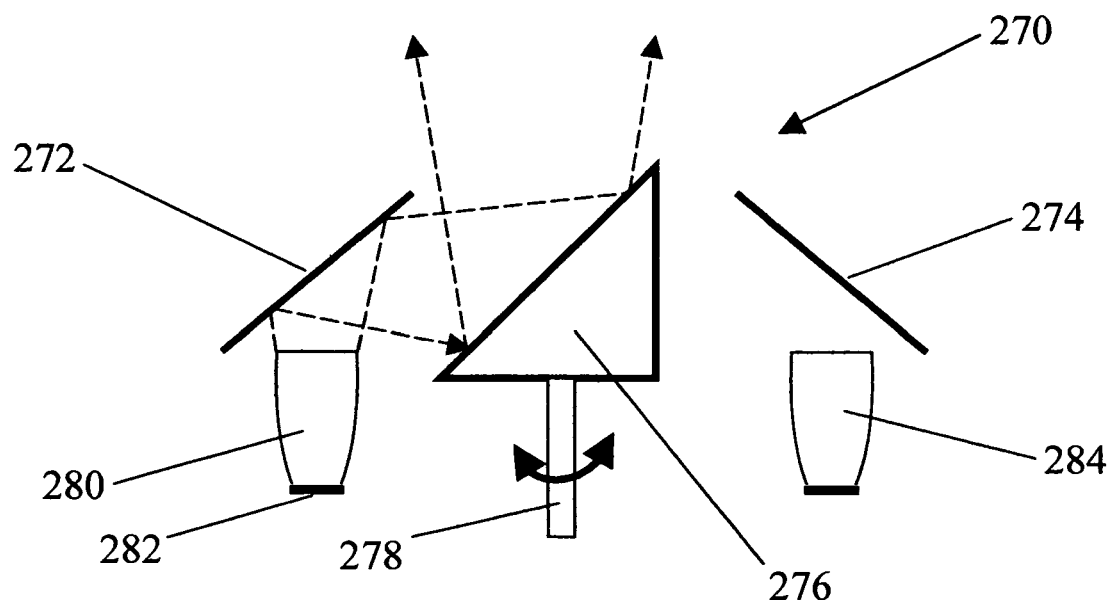
FIG. 27 is a diagrammatic view of a servo motor actuated beam coupling system that allows the LEDs to lie in the same plane for simplified cooling geometry.

FIG. 27 shows an alternative coupling embodiment in the form of a rotating scanner 270. A rotating mirror 276 revolves about an axis 278 to address one color at a time. This approach can also be extended to multiple color sources and has the advantage that the LED sources can all lie in the same plane, which simplifies the thermal design.

Figure 28:
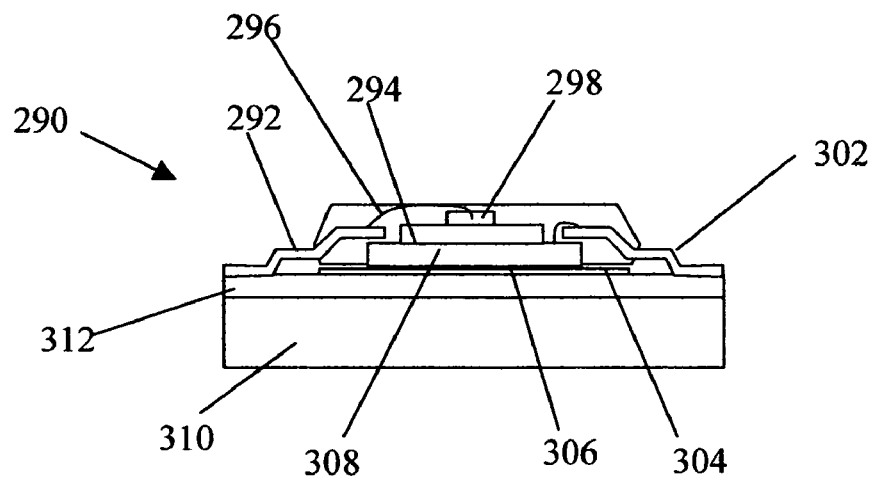
FIG. 28 is a diagrammatic elevational view of an LED package which incorporates one or more layers of thermal impedance material between the LED die and the metal substrate.
Figure 29:
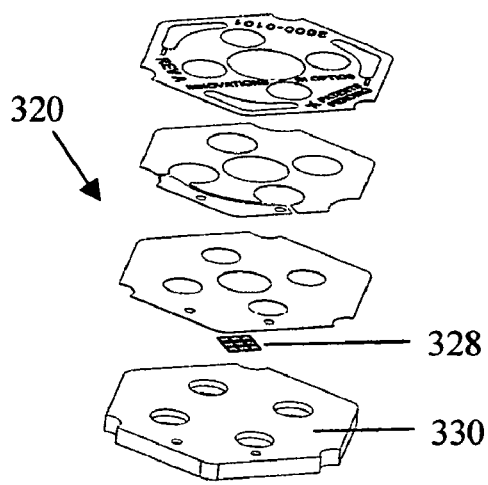
FIG. 29 shows a diagrammatic exploded perspective view of the layers of an LED board design which allows the LED die to be attached directly to the metal substrate for improved thermal performance.
Figure 30:
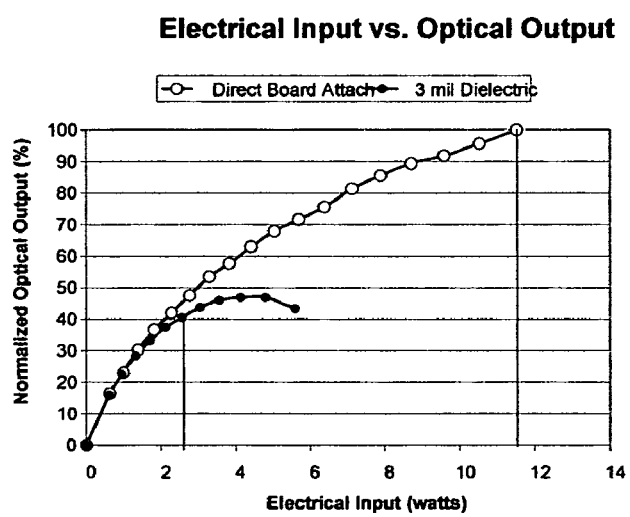
FIG. 30 is a plot of optical output versus electrical input to an LED indicating the benefit of attaching the LED die directly to a metal substrate.

FIG. 28 is representative of prior art approaches to LED board thermal management. LED board 290 comprises a high conductivity substrate 310 with one or more material layers 304, 306, 308, and 312 between the LED die 298 and the substrate 310. In contrast, FIG. 29 shows an LED board 320 which uses a laser ablation, machining, or etching process to allow the LED die 328 to be attached directly on top of the high thermal conductivity substrate 330 for significantly improved thermal performance as demonstrated by FIG. 30. The plot of FIG. 30 shows a comparison of optical output as a function of electrical input power for two cases. Case 1 is for the die directly mounted to the board as in FIG. 29 and Case 2 is for an intermediate layer of dielectric material 0.003" thick similar to, but not as bad as FIG. 28. In both cases a 1-Watt CREE XB900 die was measured into an integrating sphere. The difference between the two cases at nominal power of 1 Watt is negligible. At the higher current densities that are required of LED projection systems and Xenon lamp replacements, however, the difference is substantial. The dielectric case is shown to role over in performance at around 3 Watts of input power. The direct LED attachment case, however, achieves between 200% and 300% the output power at elevated drive powers. This is a tremendous benefit for projection systems and Xenon arc lamp replacement systems.

Figure 31:
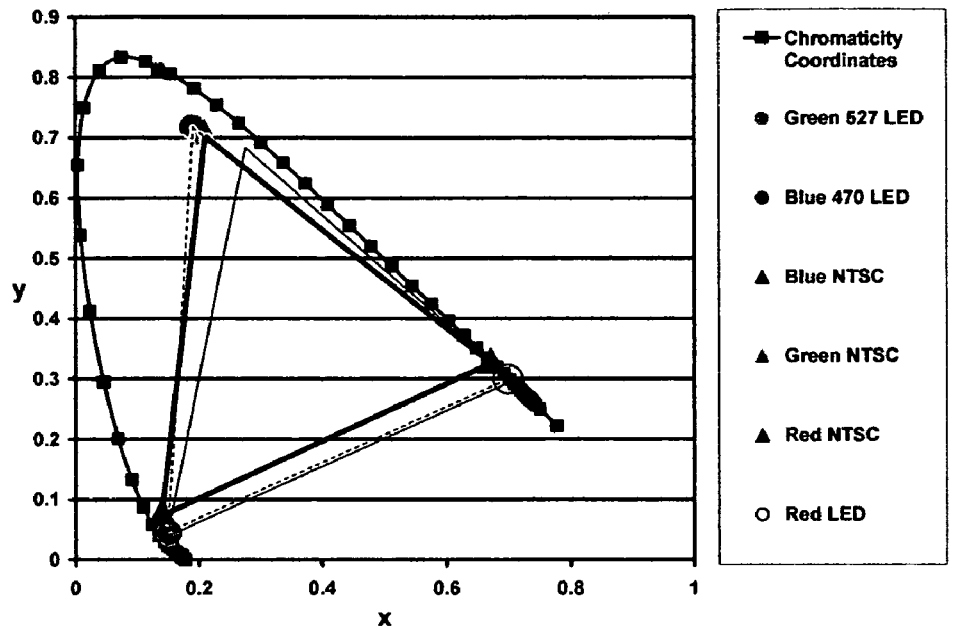
FIG. 31 is a plot of the 1931 CIE Chromaticity diagram showing the color gamut of an LED based projection system relative to the NTSC standard.
Figure 32:
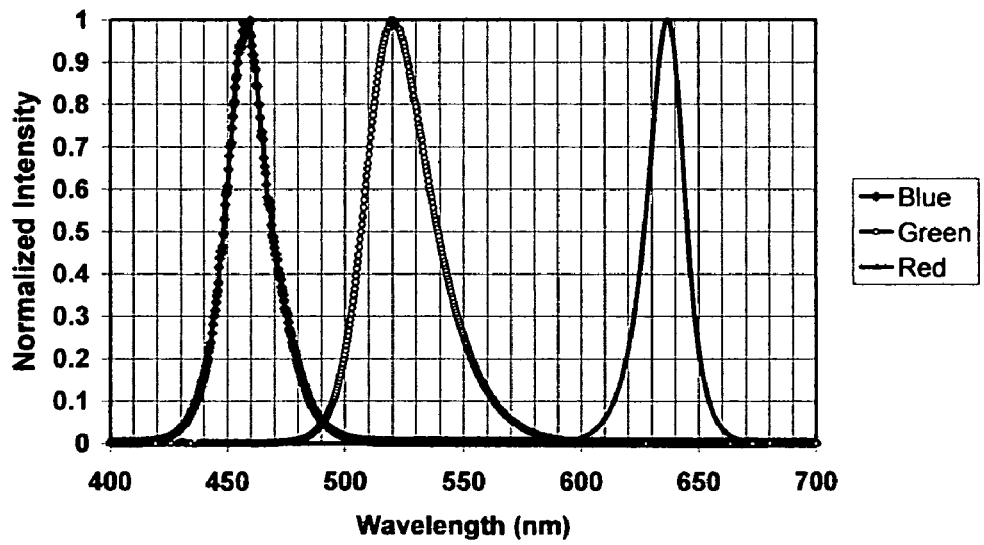
FIG. 32 is a spectral plot of blue, green, and red LED die used in an LED projection system.
Figure 33:
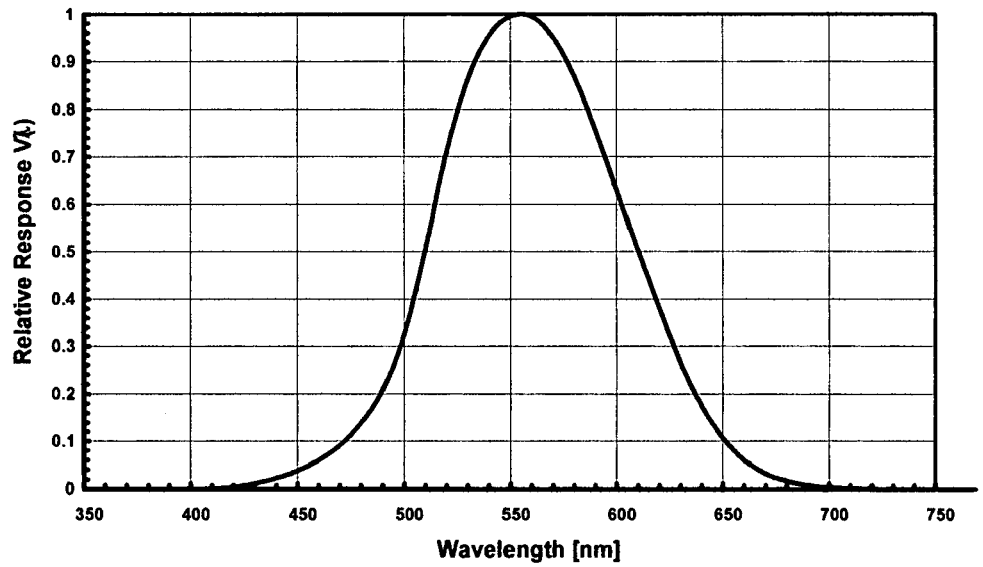
FIG. 33 is the photopic response of the human eye.

FIG. 31 shows the increased color gamut that can be achieved by the use of LED's over standard short arc lamps. The measured spectra of typical blue, green, and red LED are shown in FIG. 32. The relative contribution to the total lumens in a LED projection source comes predominantly from the green channel due to the photometric response of the eye as shown in FIG. 33.

Figure 34:
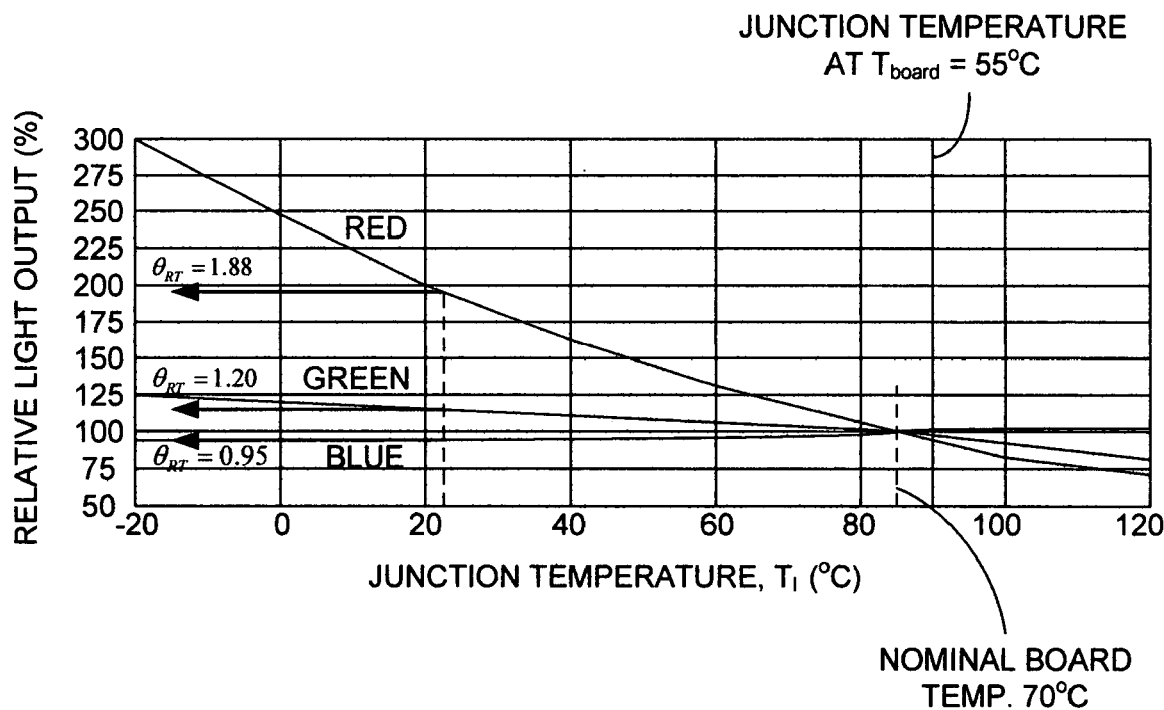
FIG. 34 is a plot indicating the differences between blue, green, and red LED die with respect to thermal coefficients.

FIG. 34 shows the typical thermal coefficients of blue, green, and red LED die. The red is shown to be significantly more sensitive to temperature than either the blue, which is the most stable, or the green, which is only slightly less stable than the green. This difference in thermal performance as well as differences in lumen maintenance with time require there to be feedback on the optical output of the three LED channels. A monitoring photodiode can readily be incorporated on the LED "chip-on-board" design to provide closed loop intensity control.

The human eye can be fooled into perceiving a higher intensity light by taking advantage of the persistence of the eye's temporal response and non-linear intensity response. If one were to modulate a light source at a frequency near 100 Hertz with a 50% duty cycle, for example, in one case and maintain 100% duty cycle in another case, with both cases having the same total integrated light, the first case would be perceived as more intense by a factor on the order of 30%. This method has been used effectively in other visual system based products and may have application to rear projection. This would not have been practical with conventional lamps, but can be with LEDs, which can be readily modulated.

One of the challenges of the illumination optical system is the fact that the modulation device (DMD for example) is not normal to the axis of the illumination system. This results in keystone as well as a depth of focus issue. Such effects can be reduced by tilting the output aperture 28 of FIG. 2 to counteract the keystoning. Other methods include the use of tilted and decentered lenses. This is best accomplished in a hollow reflector section, as dielectric light pipes at an angle result in a deviation of the beam due to refraction.

Athermalization of the illumination system may be required depending on the operational and shipping temperature extremes. One method to match the thermal expansion coefficients of plastics is to use a glass filler. Glass filled lenses and lens housings can be realized for which the expansion coefficient of the plastic can be made to match that of the LED board metal substrate.

Based on the detailed description of the structure and operation of the invention and its various embodiments, it will be apparent to those skilled in the relevant arts that other variants thereof are possible, and it is intended that such variants be within the scope of the appended claims.

What is claimed is:

1. An illumination apparatus for providing an output beam that matches the étendue of a downstream application, said illumination apparatus comprising
    at least one LED optical source having a predetermined étendue and spectral output; and
    at least one non-imaging optic for collecting substantially all of the light emitted by said at least one LED optical source and re-emitting it as a beam of substantially the same étendue as that of said LED optical source, said non-imaging optic having an entrance aperture, an exit aperture, and a non-rotationally symmetric cross-sectional shape that continuously enlarges from said entrance to said exit aperture, said at least one LED optical source being positioned at and fully across said entrance aperture so that said entrance aperture is substantially uniformly filled by said output of said LED optical source, said output of said at least one LED optical source being directed by said non-imaging optic shape to emerge from said exit aperture as a beam having substantially the same étendue as that of said at least one LED optical source but altered in angle and dimensions to substantially match the étendue of the downstream application,
    wherein said shape is rectangular to provide said beam with a near field that is also rectangular and wherein said non-imaging optic has at least two profiles of different shape as seen in planes mutually orthogonal to its longitudinal optical axis.

2. The illumination apparatus of claim 1 wherein the cross-sectional shape of said entrance and exit apertures of said non-imaging optic and the cross-sectional shape thereof is oblong.

3. The illumination apparatus of claim 1 wherein said rectangular shapes of said entrance and exit apertures differ in size and have the same aspect ratio.

4. The illumination apparatus of claim 1 wherein the far field of said beam is also rectangular.

5. The illumination apparatus of claim 1 wherein said non-imaging optic is solid being composed of a transmissive dielectric material.

6. The illumination apparatus of claim 5 wherein said at least one LED is coupled to said entrance aperture of said solid non-imaging optic with an index matching material.

7. The illumination apparatus of claim 5 wherein said at least one LED is optically coupled to said entrance aperture of said solid non-imaging optic by a non-index-matching material.

8. The illumination apparatus of claim 7 wherein said solid non-imaging optic comprises a first straight-walled section beginning with said entrance aperture and a second section having the shape of a CPC and ending with said exit aperture, said first straight walled-section and said second CPC section joining at an interface where they share common points of tangency so that said solid nonimaging optic can efficiently utilize the output of an LED that is larger than it otherwise could be without said conical section.

9. The illumination apparatus of claim 8 further including an entrance homogenizer optically coupled to said first straight-walled section and wherein said at least one LED is optically coupled to said entrance homogenizer without index matching.

10. The illumination apparatus of claim 1 wherein one of said two profiles is in the form of a CPC that runs the full length of said non-imaging optic while the other is in the form of a CPC of length shorter than the full length of said non-imaging optic.

11. The illumination apparatus of claim 10 wherein the longitudinal profile of said non-imaging optic varies as a function of the azimuthal angle looking along the optical axis to provide said beam with a far field that is substantially circular in shape.

12. The illumination apparatus of claim 1 further including a homogenizer having one end optically coupled to said input aperture of said non-imaging optic and one end optically coupled to said at least one LED.

13. A projection apparatus for forming video images, said projection apparatus comprising:
at least one LED optical source having a predetermined étendue and spectral output;
a digital device for selectively modulating light incident thereto, said digital device having a given étendue;
at least one non-imaging optic for collecting substantially all of the light emitted by said at least one LED optical source and re-emitting it as a spatially uniform beam of substantially the same étendue as that of said LED optical source, said non-imaging optic having an entrance aperture, an exit aperture, and a nonrotationally symmetric cross-sectional shape that continuously enlarges from said entrance to said exit aperture, said at least one LED optical source being positioned at and fully across said entrance aperture so that said entrance aperture is substantially uniformly filled by said output of said LED optical source, said output of said at least one LED optical source being directed by said non-imaging optical shape to emerge from said exit aperture as a beam having substantially the same étendue as that of said at least one LED optical source but altered in angle and dimensions to substantially match the étendue of said digital device;
a relay lens for imaging the near field from said non-imaging optic onto said digital device to form video images;
a screen for viewing images formed thereon; and
a projection lens for projecting said digital device onto said screen as said digital device is modulated so that video images formed thereon can be observed on said viewing screen,
wherein said relay lens images the far field of said beam from said non-imaging optic into the aperture stop of said projection lens.

14. The projection apparatus of claim 13 wherein said digital device is selected from the group consisting of rectangular shaped DMDs, LCOS chips, and LCD chips.

15. An illumination apparatus for providing an output beam that matches the &endue of a downstream application, said illumination apparatus comprising
at least one LED optical source having a predetermined étendue and spectral output; and
at least one solid non-imaging optic for collecting substantially all of the light emitted by said at least one LED optical source and re-emitting it as a spatially uniform beam of substantially the same étendue as that of said LED optical source, said non-imaging optic having an entrance aperture, an exit aperture, and a rotationally symmetric cross-sectional shape that continuously enlarges from said entrance to said exit aperture, said at least one LED optical source being air spaced from and fully across said entrance aperture so that (said entrance aperture is substantially uniformly filled by said output of said LED optical source, said output of said at least one LED optical source being directed by said non-imaging optical shape to emerge from said exit aperture as a beam having substantially the same étendue as that of said at least one LED optical source but altered in angle and dimensions to substantially match the étendue of the downstream application,
wherein said at least one solid non-imaging optic comprises a first conical section beginning with said entrance aperture and a second section haying the shape of a CPC and ending with said exit aperture, said first conical section and said second CPC section transitioning at a cross-sectional location of said at least one non-imaging optic where they share common points of tangency so that said at least one solid non-imaging optic can efficiently utilize the output of an LED that is larger than it otherwise could be without said conical section.

16. The illumination apparatus of claim 15 further including a entrance homogenizer optically coupled to said first straight-walled section and wherein said at least one LED is optically coupled to said entrance homogenizer without index matching.

17. An LED apparatus comprising:
a bare LED die having an emitting surface that is at least in part diffusely reflective; and
a low absorption encapsulant conformally overlying said bare LED die, said low absorption encapsulant being formed of a material having an index of refraction greater than unity so as to operate to at least in part totally internally reflect light at the encapsulant air interface so that it impinges onto said diffusely reflective emitting surface after which it is at least in part transmitted back through said encapsulant air interface so that the overall output of said apparatus is increased over what it would otherwise be without said encapsulant.

18. The LED apparatus of claim 17 wherein said index of refraction of said encapsulant material is 1.5 or more and wherein the diffuse reflectivity of said emitting surface exceeds 50 percent.

19. An illumination apparatus for providing an output beam that matches the étendue of a downstream application, said illumination apparatus comprising
at least two LED optical sources having a predetermined étendue and different spectral output beams;
at least two non-imaging optics for collecting substantially all of the light emitted by said at least two LED optical source and re-emitting it as a beam of substantially the same étendue as that of said LED optical source, said non-imaging optic having an entrance aperture, an exit aperture, and a non-rotationally symmetric cross-sectional shape that continuously enlarges from said entrance to said exit aperture, said at least one LED optical source being positioned at and fully across said entrance aperture so that said entrance aperture is substantially uniformly filled by said output of said LED optical source, said output of said at least one LED optical source being directed by said non-imaging optic shape to emerge from said exit aperture as a beam having substantially the same étendue as that of said at least two LED optical sources but altered in angle and dimensions to substantially match the étendue of the downstream application, a combiner for receiving the outputs from said beams from said at least two non-imaging optics having different spectral content and combining them for travel as a single beam whose content is a uniform mixture of the spectral content of both beams, and a beam homogenizer for receiving said single beam emerging from said combiner, said homogenizer being tilted to compensate for keystoning effects.

20. The illumination apparatus of claim 19 wherein said combiner is configured and arranged to operate to pipe light therethrough in at least two directions.

21. The illumination apparatus of claim 19 wherein said combiner comprises an optical device selected from the group consisting of X-cubes, X-plates, beam splitters, transmission gratings, dynamic prisms with one selectively separable interface, dynamic prisms with two selectively separable interfaces, tilting mirrors, and rotating prisms.

22. The illumination apparatus of claim 19 wherein said homogenizer is hollow.

23. The illumination apparatus of claim 19 wherein said spectral content of said beams comprise R, G, B colors so that, when combined, they produce white light.

24. An illumination apparatus for providing an output beam that matches the étendue of a downstream application, said illumination apparatus comprising at least one LED optical source having a predetermined étendue and spectral output;

at least one non-imaging optic for collecting substantially all of the light emitted by said at least one LED optical source and re-emitting it as a beam of substantially the same étendue as that of said LED optical source, said non-imaging optic having an entrance aperture, an exit aperture, and a non-rotationally symmetric cross-sectional shape that continuously enlarges from said entrance to said exit aperture, said at least one LED optical source being positioned at and fully across said entrance aperture so that said entrance aperture is substantially uniformly filled by said output of said LED optical source, said output of said at least one LED optical source being directed by said non-imaging optical-optic shape to emerge from said exit aperture as a beam having substantially the same étendue as that of said at least one LED optical source but altered in angle and dimensions to substantially match the étendue of the downstream application, a digital device for selectively modulating light incident thereto; and a relay lens for imaging the near field from said nonimaging optic onto said digital device to form video images, said relay lens imaging the far field of said beam from said non-imaging optic into the aperture stop of said projection lens.

25. The illumination apparatus of claim 24 wherein said digital device is selected from the group consisting of rectangular shaped DMDs, LCOS chips, and LCD chips.

26. The illumination apparatus of claim 24 further including a projection lens and a screen for projecting said digital device onto said screen as said digital device is modulated so that the video images formed thereon can be observed on said screen.

27. The illumination apparatus of claim 7 wherein entrance aperture is enlarged compared with what it would otherwise be when index matched to said LED to increase the étendue of the downstream application.

\* \* \* \* \*